US012604609B2

(12) United States Patent
Yoon

(10) Patent No.: US 12,604,609 B2
(45) Date of Patent: Apr. 14, 2026

(54) DISPLAY APPARATUS HAVING A LIGHT-BLOCKING PATTERN

(71) Applicant: LG Display Co., Ltd., Seoul (KR)

(72) Inventor: Sung Eun Yoon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 916 days.

(21) Appl. No.: 17/887,233

(22) Filed: Aug. 12, 2022

(65) Prior Publication Data

US 2023/0059165 A1     Feb. 23, 2023

(30) Foreign Application Priority Data

Aug. 23, 2021     (KR) ......................... 10-2021-0111006

(51) Int. Cl.
  *H10K 50/86*       (2023.01)
  *H10K 59/121*      (2023.01)
  *H10K 59/131*      (2023.01)
(52) U.S. Cl.
  CPC ....... *H10K 50/865* (2023.02); *H10K 59/1213* (2023.02); *H10K 59/1216* (2023.02); *H10K 59/131* (2023.02)
(58) Field of Classification Search
  None
  See application file for complete search history.

(56) References Cited

U.S. PATENT DOCUMENTS

2017/0170206 A1*  6/2017  Lee ...................... H10K 77/111
2021/0050398 A1*  2/2021  Kim ................... H10K 59/1201

2021/0143239 A1*  5/2021  Kim ..................... H10D 86/451
2021/0202568 A1*  7/2021  Kim ..................... H01L 25/167
2022/0310730 A1*  9/2022  Zhao ................... H10D 86/423
(Continued)

FOREIGN PATENT DOCUMENTS

KR    1020190042132    4/2019
KR    10-2019-0073849 A    6/2019
(Continued)

OTHER PUBLICATIONS

Office Action issued on Sep. 3, 2025 in Korean Patent Application No. 10-2021-0111006.

*Primary Examiner* — Alexander G Ghyka
(74) *Attorney, Agent, or Firm* — Morgan, Lewis & Bockius LLP

(57) ABSTRACT

A display apparatus includes a light-blocking pattern on a pixel area of a device substrate; an upper buffer layer on the light-blocking pattern extending on a bending area of the device substrate; a switching thin film transistor on the upper buffer layer including a first semiconductor pattern spaced away from the light-blocking pattern; a separation insulating layer on the first semiconductor pattern extending on the upper buffer layer of the bending area; a driving thin film transistor on the separation insulating layer of the pixel area including a second semiconductor pattern overlapping with the light-blocking pattern; a bending open hole on the bending area including a first bending hole exposing a portion of the upper buffer layer and a second bending hole in the first bending hole; and an intermediate electrode on the separation insulating layer connected to the light-blocking pattern through an intermediate contact hole.

17 Claims, 22 Drawing Sheets

(56)          References Cited

U.S. PATENT DOCUMENTS

| 2023/0118675 | A1* | 4/2023 | Kim ..................... H10K 77/111 |
| | | | 345/174 |
| 2024/0128423 | A1 | 4/2024 | Noh et al. |
| 2024/0414945 | A1 | 12/2024 | Kim et al. |

FOREIGN PATENT DOCUMENTS

| KR | 10-2021-0014966 A | 2/2021 |
| KR | 1020210086275 | 7/2021 |

* cited by examiner

DISPLAY APPARATUS HAVING A LIGHT-BLOCKING PATTERN

CROSS-REFERENCE TO RELATED APPLICATIONS

This application claims the benefit of Korean Patent Application No. 10-2021-0111006 filed on Aug. 23, 2021, which is hereby incorporated by reference as if fully set forth herein.

BACKGROUND

Technical Field

The present disclosure relates to a display apparatus in which a light-blocking pattern is disposed in each pixel area.

Discussion of the Related Art

Generally, a display apparatus provides an image to user. For example, the display apparatus may include a plurality of pixel area. A light-emitting device may be disposed in each pixel area. The light-emitting device may emit light displaying a specific color. For example, the light-emitting device may include a light-emitting layer between a first electrode and a second electrode.

A driving circuit electrically connected to the light-emitting device may be disposed in each pixel area. The driving circuit may apply a driving current corresponding to a data signal to the light-emitting device according to a gate signal. For example, the driving circuit may include a switching thin film transistor and a driving thin film transistor.

The driving thin film transistor may generate the driving current corresponding to the data signal. The driving current applied to the light-emitting device may be affected by external light incident on a semiconductor pattern of the driving thin film transistor. For example, a light-blocking pattern blocking the external light travelling toward the semiconductor pattern of the driving thin film transistor may be disposed in each pixel area.

A specific voltage may be applied to the light-blocking pattern. However, in the display apparatus, an additional mask for forming a contact hole connecting the light-blocking pattern to one of signal wirings may be used. Therefore, in the display apparatus, the process efficiency may be degraded.

SUMMARY

Accordingly, embodiments of the present disclosure are directed to a display apparatus that substantially obviates one or more of the problems due to limitations and disadvantages of the related art.

An aspect of the present disclosure is to provide a display apparatus capable of effectively preventing a change in the characteristics of the driving thin film transistor due to the external light, without degrading the process efficiency.

Another aspect of the present disclosure is to provide a display apparatus capable of connecting the light-blocking pattern of each pixel area to one of the signal wirings, without using the additional mask.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display apparatus comprises a light-blocking pattern on a pixel area of a device substrate. An upper buffer layer is disposed on the light-blocking pattern. The upper buffer layer extends on a bending area of the device substrate. A switching thin film transistor is disposed on the upper buffer layer of the pixel area. The switching thin film transistor includes a first semiconductor pattern spaced away from the light-blocking pattern. A separation insulating layer is disposed on the first semiconductor pattern. The separation insulating layer extends on the upper buffer layer of the bending area. A driving thin film transistor and an intermediate electrode are disposed on the separation insulating layer of the pixel area. The driving thin film transistor includes a second semiconductor pattern overlapping with a portion of the light-blocking pattern. The intermediate electrode is connected to the light-blocking pattern through an intermediate contact hole. The intermediate contact hole includes a first intermediate hole partially exposing the upper buffer layer of the pixel area and a second intermediate hole partially exposing a portion of the light-blocking pattern overlapping with the first intermediate hole. A bending open hole is disposed on the bending area of the device substrate. The bending open hole includes a first bending hole exposing a portion of the upper buffer layer and a second bending hole exposing a portion of the device substrate in the first bending hole. A vertical depth of the first intermediate hole is the same as a vertical depth of the first bending hole.

The first semiconductor pattern may include silicon. The second semiconductor pattern may include an oxide semiconductor.

A vertical depth of the second intermediate hole may smaller than a vertical depth of the second bending hole.

The bending area of the device substrate may include a substrate recess region overlapping with the second bending hole.

A bottom surface of the first intermediate hole may be disposed closer to the device substrate than an upper surface of the upper buffer layer. The upper buffer layer of the bending area may include an upper recess region overlapping with the first bending hole.

A vertical depth of the upper recess region may be the same as a distance between a bottom surface of the first intermediate hole and an upper surface of the upper buffer layer.

A source electrode of the switching thin film transistor may be connected to a source region of the first semiconductor pattern through a source contact hole. A drain electrode of the switching thin film transistor may be connected to a drain region of the first semiconductor pattern through a drain contact hole. The source contact hole and the drain contact hole may penetrate the first semiconductor pattern.

A vertical depth of the source contact hole may be the same as a vertical depth of the first intermediate hole. A vertical depth of the drain contact hole may be the same as the vertical depth of the source contact hole.

A lower buffer layer may be disposed between the device substrate and the upper buffer layer. The lower buffer layer may extend between the device substrate and the light-blocking pattern.

The light-blocking pattern may include a blocking recess region overlapping with the second intermediate hole.

In another embodiment, there is provided a display apparatus comprising a device substrate. The device substrate includes a pixel area and a bending area. A buffer insulating layer is disposed on the device substrate. A buffer insulating layer has a stacked structure of a lower buffer layer and an upper buffer layer. A light-blocking pattern is disposed between the lower buffer layer and the upper buffer layer of the pixel area. A first switching thin film transistor is disposed on the upper buffer layer of the pixel area. The first switching thin film transistor includes a first semiconductor pattern disposed outside the light-blocking pattern. A separation insulating layer covering the first semiconductor pattern extends on the upper buffer layer of the bending area. A driving thin film transistor and an intermediate electrode are disposed on the separation insulating layer of the pixel area. The driving thin film transistor includes a second semiconductor pattern overlapping with a portion of the light-blocking pattern. The intermediate electrode is connected to the light-blocking pattern through an intermediate contact hole. A bending open hole is disposed on the bending area of the device substrate. The bending open hole includes a first bending hole exposing a portion of the lower buffer layer and a second bending hole exposing a portion of the device substrate in the first bending hole. A vertical depth of the first bending hole is greater than or equal to a vertical depth of the intermediate contact hole.

A second switching thin film transistor may be disposed on the separation insulating layer of the pixel area. The second switching thing film transistor may include a third semiconductor pattern made of the same material as the second semiconductor pattern. The third semiconductor pattern may be spaced away from the intermediate electrode and the second semiconductor pattern.

The lower buffer layer of the bending area may include a lower recess region overlapping with the first bending hole.

A source electrode of the first switching thin film transistor may be connected to a source region of the first semiconductor pattern through a source contact hole. A drain electrode of the first switching thin film transistor may be connected to a drain region of the first semiconductor pattern through a drain contact hole. A bottom surface of the source contact hole and a bottom surface of the drain contact hole may be disposed closer to the device substrate than an upper surface of the lower buffer layer.

A capacitor upper electrode may be disposed between the light-blocking pattern and the second semiconductor pattern.

The capacitor upper electrode may include a material different from a gate electrode of the first switching thin film transistor.

A substrate hole may be disposed in a hole area of the device substrate. A separation area may be disposed between the pixel area and the hole area. A separating partition may be disposed in the separation area. The separating partition may include at least one under-cut. A vertical distance of the separating partition may be greater than a vertical depth of the bending open hole.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings:

FIG. 3A is an enlarged view of P1 region in FIG. 2;

FIG. 3B is an enlarged view of P2 region in FIG. 2;

FIG. 3C is an enlarged view of P3 region in FIG. 2;

FIGS. 4 to 18 are views sequentially showing a method of forming the display apparatus according to the embodiment of the present disclosure;

FIGS. 19 to 23, 27, 29 and 30 are views showing the display apparatus according to another embodiment of the present disclosure;

FIG. 24 is an enlarged view of P4 region in FIG. 23;

FIGS. 25 and 26 are views sequentially showing a method of forming the display apparatus according to another embodiment of the present disclosure;

Figure 28A:
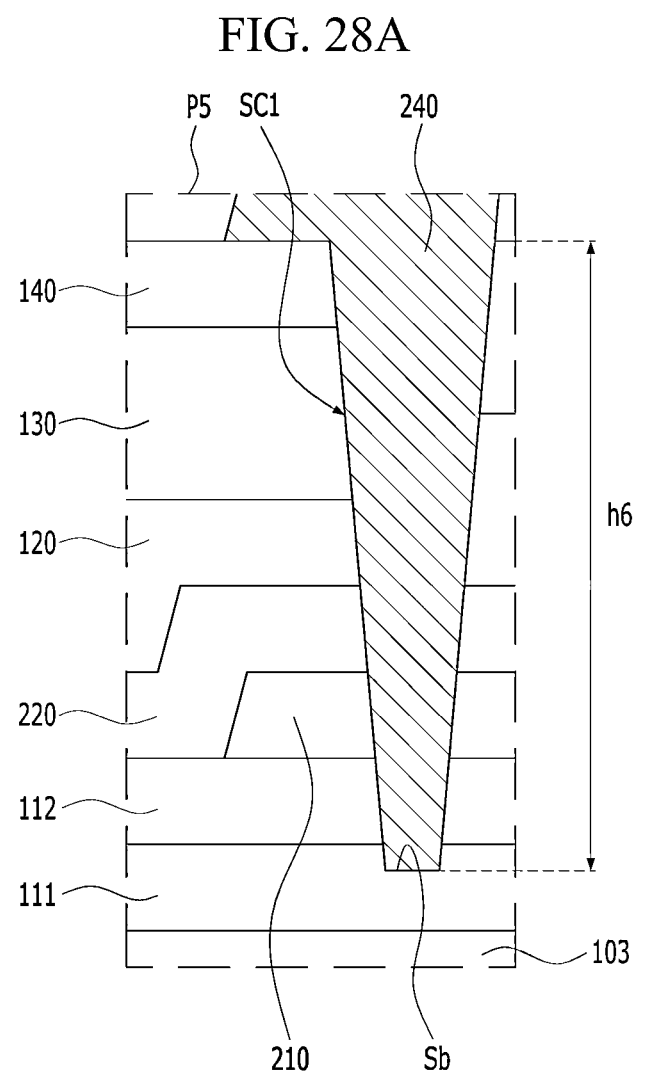
Figure 28B:
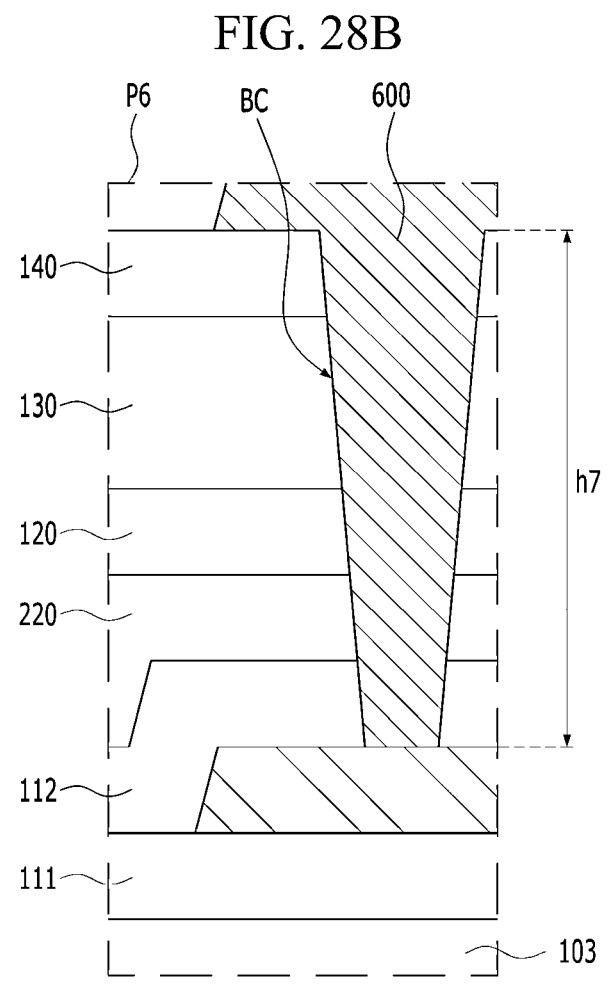

FIG. 28A is an enlarged view of P5 region in FIG. 27;

FIG. 28B is an enlarged view of P6 region in FIG. 27; and

DETAILED DESCRIPTION

Figure 1:
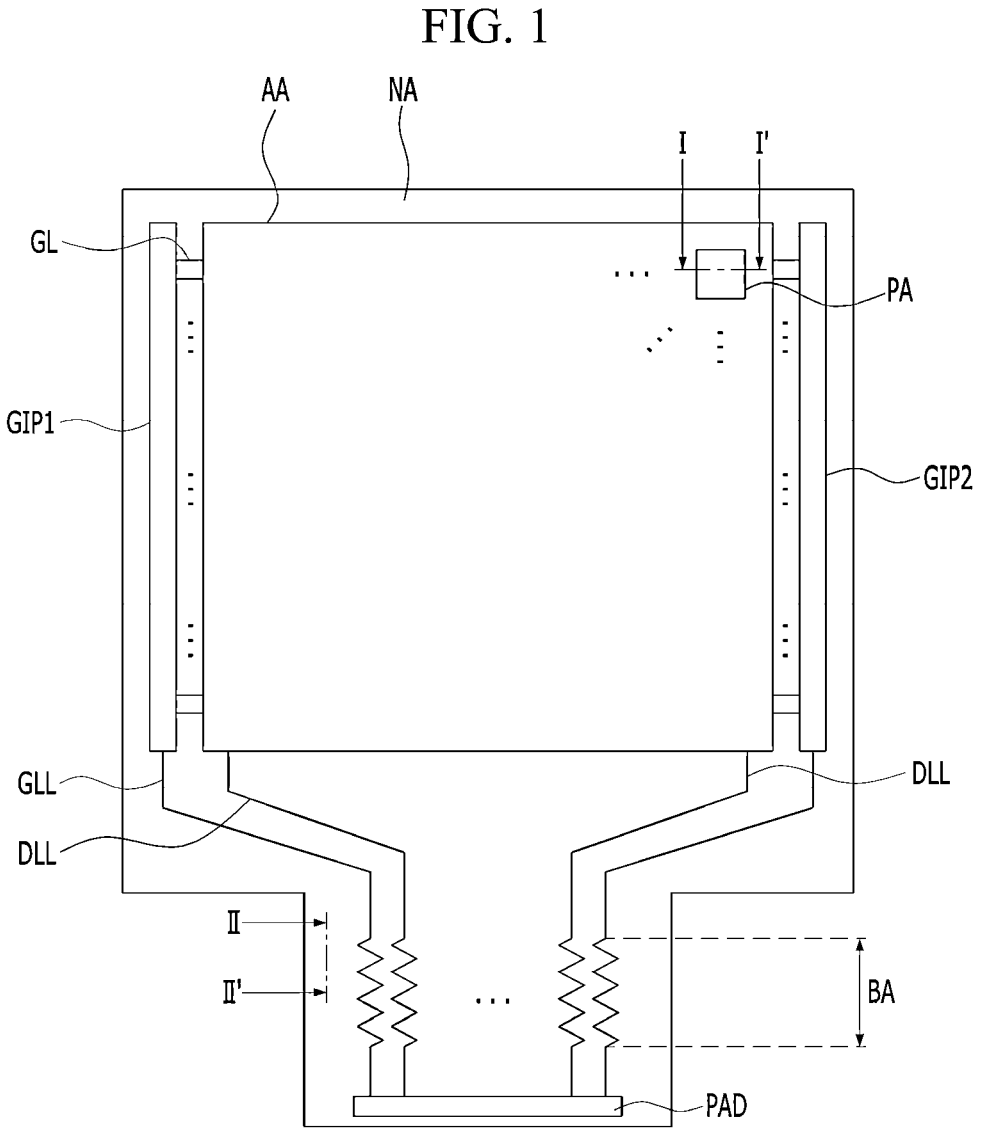
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
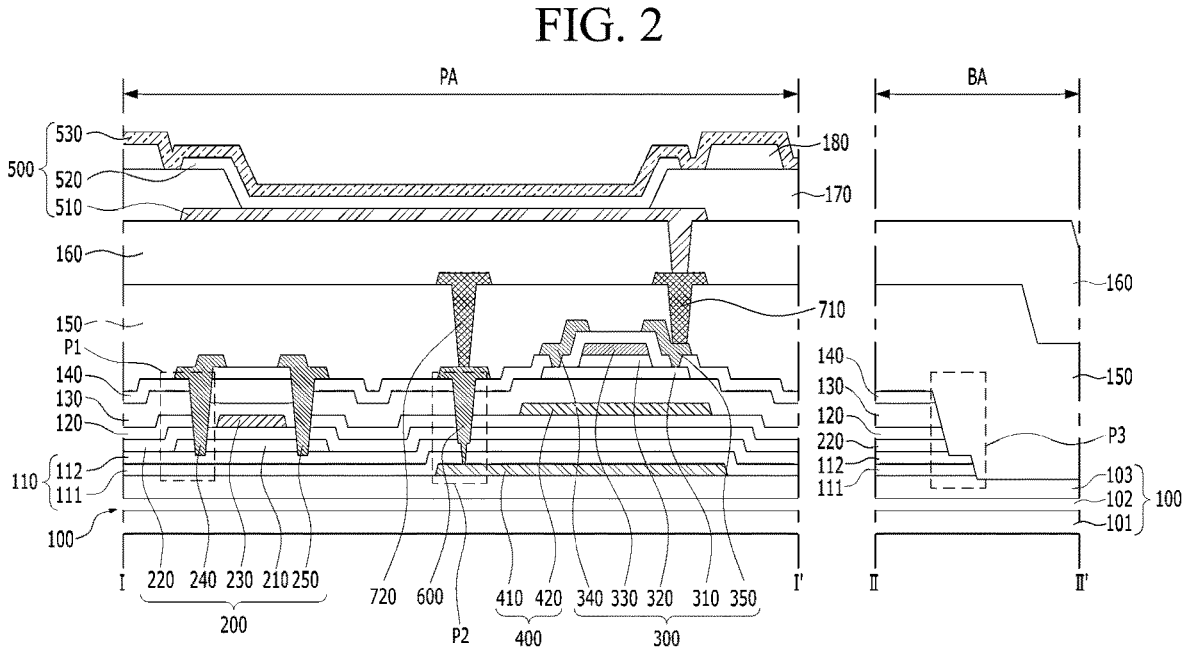
FIG. 2 is a view taken along line I-I' and line II-II' of FIG. 1.
Figure 3A:
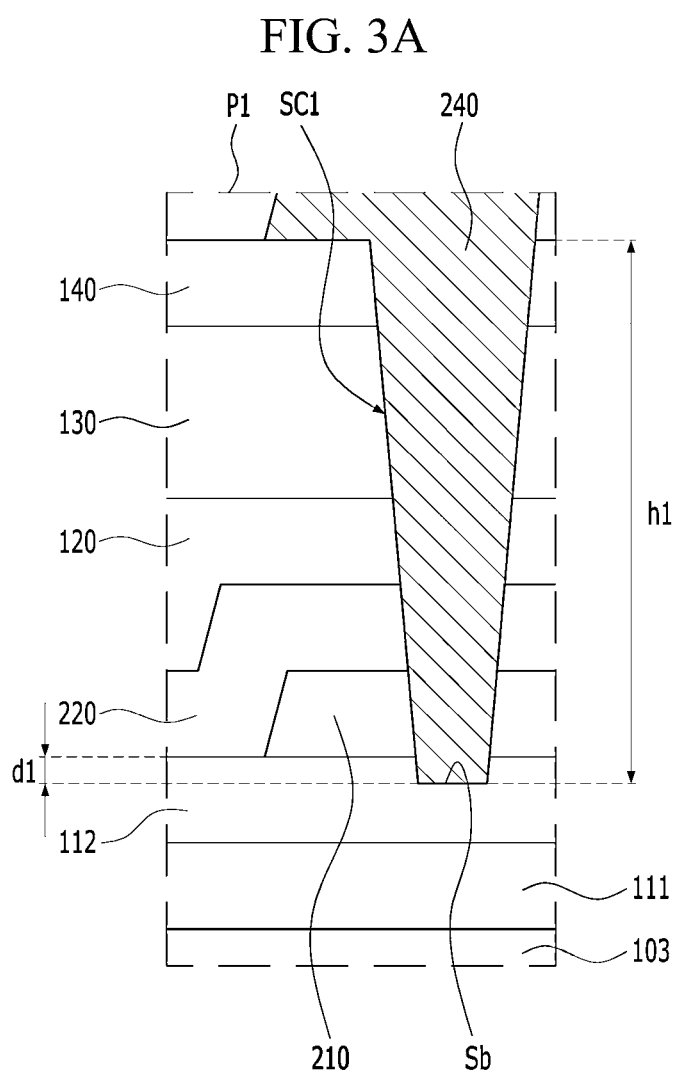
Figure 3B:
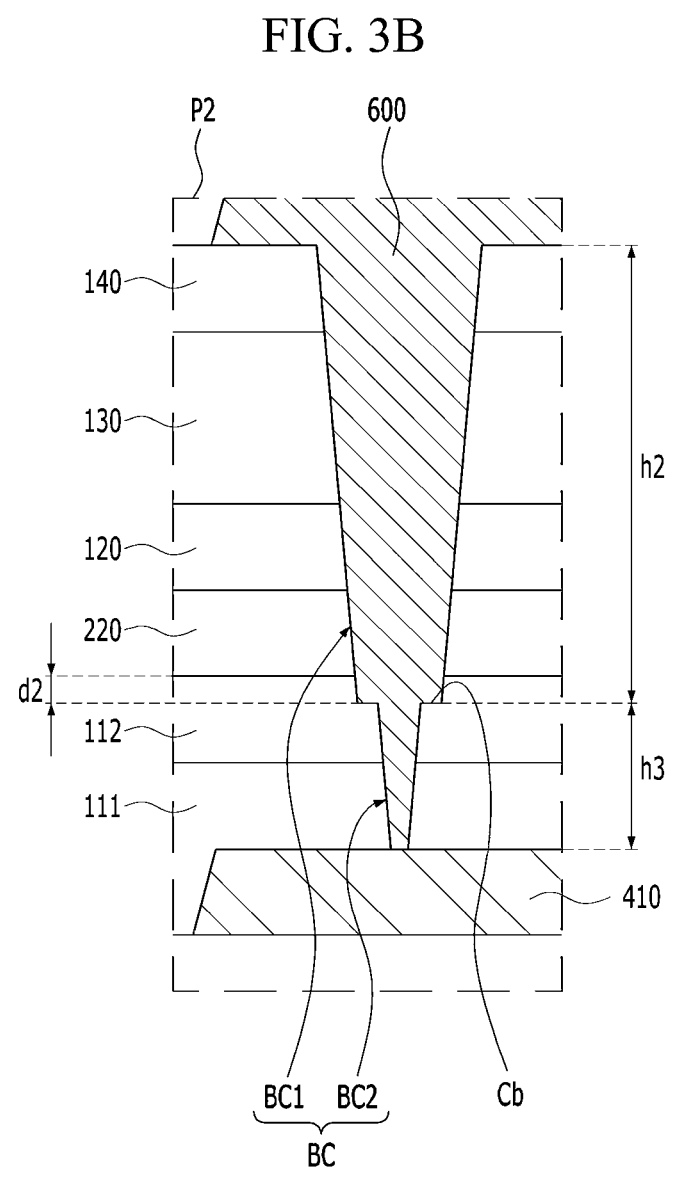
Figure 3C:
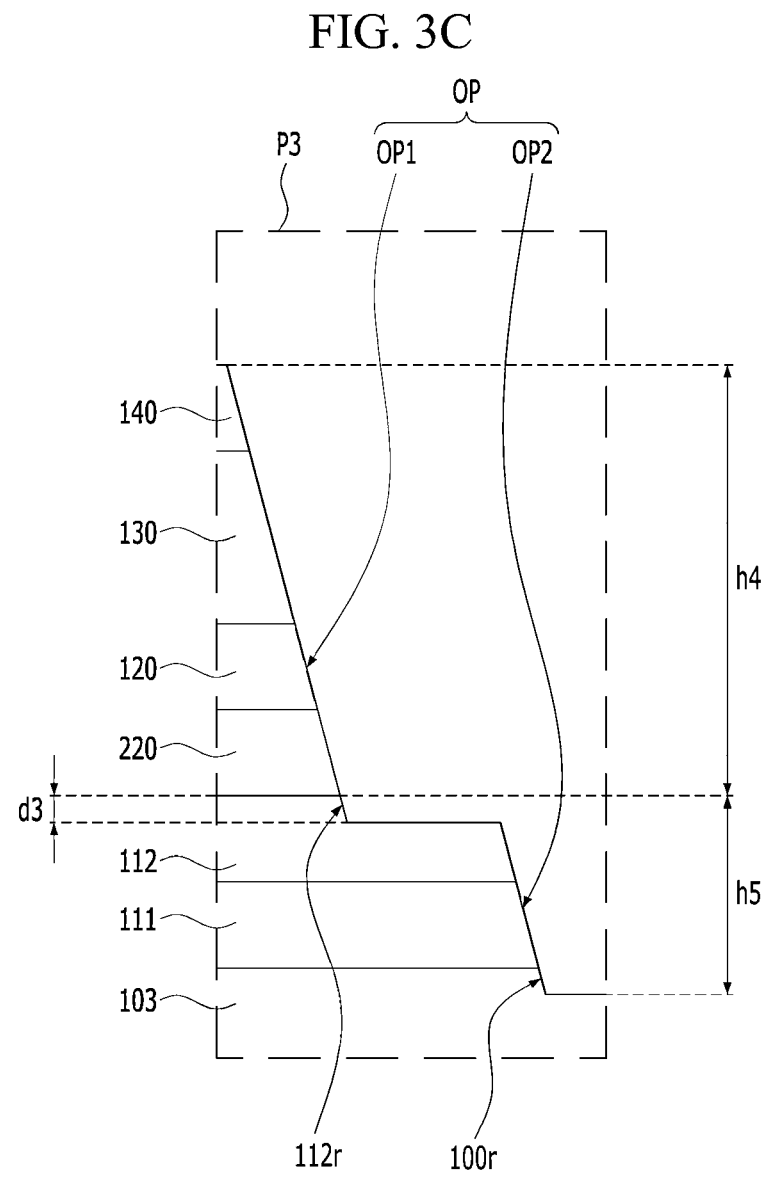

FIG. 1 is a view schematically showing a display apparatus according to an embodiment of the present disclosure. FIG. 2 is a view taken along line I-I' and line II-II' of FIG. 1. FIG. 3A is an enlarged view of P1 region in FIG. 2. FIG. 3B is an enlarged view of P2 region in FIG. 2. FIG. 3C is an enlarged view of P3 region in FIG. 2.

Referring to FIGS. 1, 2, and 3A to 3C, the display apparatus according to the embodiment of the present disclosure may include a device substrate 100. The device substrate 100 may include a flexible material. The device substrate 100 may have a multi-layer structure. For example, the device substrate 100 may have a stacked structure of a first substrate layer 101, a substrate insulating layer 102 and a second substrate layer 103. The second substrate layer 103 may include the same material as the first substrate layer 101. For example, the first substrate layer 101 and the second substrate layer 103 may include a polymer material, such as poly-imide (PI). The substrate insulating layer 102 may include an insulating material. For example, the substrate insulating layer 102 may include an inorganic insulating material, such as silicon oxide (SiO) and silicon nitride (SiN). Thus, in the display apparatus according to the embodiment of the present disclosure, the damage of the device substrate 100 due to the bending stress may be prevented.

The device substrate 100 may include a display area AA and a non-display area NA. The display area AA may generate an image being provided to a user. For example, a plurality of pixel area PA may be disposed in the display area AA. The non-display area NA may provide various signals for generating the image to each pixel area PA of the display area AA. For example, the display apparatus according to the embodiment of the present disclosure may be a GIP (gate in panel) type display apparatus in which at least one gate driver GIP1 and GIP2 is mounted on the non-display area NA of the device substrate 100. The gate driver GIP1 and GIP2 may sequentially apply a gate signal to each pixel area PA of the display area AA through gate lines GL.

A pad portion PAD electrically connected to a data driver may be disposed in the non-display area NA of the device substrate 100. A data signal may be applied to each pixel area PA of the display area AA through the pad portion PAD. For example, each pixel area PA of the display area AA may be connected to the pad portion PAD through one of data lines and one of data link lines DLL. The data link lines DLL may be disposed between the display area AA and the pad portion PAD, and the data lines electrically connected to the data link lines DLL may be disposed in the display area AA. Clock signals, reset clock signals and start signals may be applied to the gate driver GIP1 and GIP2 through the pad portion PAD. For example, the gate driver GIP1 and GIP2 may be connected to the pad portion PAD through gate link line GLL.

The device substrate 100 may be curved, partially. For example, a bending area BA may be disposed in the non-display area NA of the device substrate 100. The bending area BA may be disposed between the display area AA and the pad portion PAD. For example, in the display apparatus according to the embodiment of the present disclosure, the bending area BA of the device substrate 100 may be bent, and the pad portion PAD may be disposed on a lower surface of the device substrate 100.

A driving circuit may be disposed on each pixel area PA of the device substrate 100. The driving circuit may be electrically connected to one of the gate lines GL and one of the data lines. The driving circuit may generate a driving current corresponding to the data signal according to the gate signal. For example, the driving circuit may include a switching thin film transistor 200 and a driving thin film transistor 300.

The switching thin film transistor 200 may include a first semiconductor pattern 210, a first gate insulating layer 220, a first gate electrode 230, a first source electrode 240 and a first drain electrode 250.

The first semiconductor pattern 210 may be disposed close to the device substrate 100. The first semiconductor pattern 210 may include a semiconductor material. For example, the first semiconductor pattern 210 may include a low-temperature poly-Si (LTPS). The first semiconductor pattern 210 may include a first source region, a first channel region and a first drain region. The first channel region may be disposed between the first source region and the first drain region. The first source region and the first drain region may have a resistance lower than the first channel region. For example, the first source region and the first drain region may include conductive impurities.

The first gate insulating layer 220 may be disposed on the first semiconductor pattern 210. The first gate insulating layer 220 may extend beyond the first semiconductor pattern 210. For example, a side of the first semiconductor pattern 210 may be covered by the first gate insulating layer 220. The first gate insulating layer 220 may include an insulating material. For example, the first gate insulating layer 220 may include an inorganic insulating material, such as silicon oxide (SiO) and silicon nitride (SiN).

The first gate electrode 230 may be disposed on the first gate insulating layer 220. For example, the first gate electrode 230 may overlap the first channel region of the first semiconductor pattern 210. The first gate electrode 230 may include a conductive material. For example, the first gate electrode 230 may include a metal, such as aluminum (Al), titanium (Ti), copper (Cu), chrome (Cr), molybdenum (Mo) and tungsten (W). The first gate electrode 230 may be insulated from the first semiconductor pattern 210 by the first gate insulating layer 220. For example, the first channel region of the first semiconductor pattern 210 may have an electrical conductivity corresponding to a voltage applied to the first gate electrode 230.

The first source electrode 240 may be disposed on the first gate insulating layer 220. The first source electrode 240 may include a conductive material. For example, the first source electrode 240 may include a metal, such as aluminum (Al), titanium (Ti), copper (Cu), chrome (Cr), molybdenum (Mo) and tungsten (W). The first source electrode 240 may be insulated from the first gate electrode 230. The first source electrode 240 may be disposed on a layer different from the first gate electrode 230. For example, a first interlayer insulating layer 120 may be disposed on the first gate electrode 230, and the first source electrode 240 may be disposed on the first interlayer insulating layer 120. The first interlayer insulating layer 120 may include an insulating material. For example, the first interlayer insulating layer 120 may include an inorganic insulating material, such as silicon oxide (SiO) and silicon nitride (SiN). The first interlayer insulating layer 120 may extend beyond the first gate electrode 230. For example, a side of the first gate electrode 230 may be covered by the first interlayer insulating layer 120. The first source electrode 240 may include a material different from the first gate electrode 230.

The first source electrode 240 may be electrically connected to the first source region of the first semiconductor pattern 210. For example, the first gate insulating layer 220 and the first interlayer insulating layer 120 may include a first source contact hole SC1 partially exposing the first source region of the first semiconductor pattern 210. The first source electrode 240 may be in direct contact with the first source region of the first semiconductor pattern 210 through the first source contact hole SC1. The first source contact hole SC1 may completely penetrate the first semiconductor pattern 210. For example, a bottom surface Sb of the first source contact hole SC1 toward the device substrate 100 may be disposed closer to the device substrate 100 than a bottom surface of the first semiconductor pattern 210 toward the device substrate 100. The first source region of the first semiconductor pattern 210 may be contact with a side of the first source electrode 240.

The first drain electrode 250 may be disposed on the first gate insulating layer 220. The first drain electrode 250 may include a conductive material. For example, the first drain electrode 250 may include a metal, such as aluminum (Al), titanium (Ti), copper (Cu), chrome (Cr), molybdenum (Mo) and tungsten (W). The first drain electrode 250 may be insulated from the first gate electrode 230. The first drain electrode 250 may be disposed on a layer different from the first gate electrode 230. For example, the first drain electrode 250 may be disposed on the first interlayer insulating layer 120. The first drain electrode 250 may be disposed on the same layer as the first source electrode 240. For example, the first drain electrode 250 may include the same material as the first source electrode 240. The first drain electrode 250 may include a material different from the first gate electrode 230.

The first drain electrode 250 may be electrically connected to the first drain region of the first semiconductor pattern 210. For example, the first gate insulating layer 220 and the first interlayer insulating layer 120 may include a first drain contact hole partially exposing the first drain region of the first semiconductor pattern 210. The first drain electrode 250 may be in direct contact with the first drain region of the first semiconductor pattern 210 through the first drain contact hole. A vertical depth of the first drain contact hole may be the same as a vertical depth h1 of the first source contact hole SC1. For example, the first drain contact hole may completely penetrate the first semiconductor pattern 210. A bottom surface of the first drain contact hole toward the device substrate 100 may be disposed closer to the device substrate 100 than a lower surface of the first semiconductor pattern 210. The first drain region of the first semiconductor pattern 210 may be in contact with a side of the first drain electrode 250.

The driving thin film transistor 300 may have the same structure as the switching thin film transistor 200. For example, the driving thin film transistor 300 may include a second semiconductor pattern 310, a second gate insulating layer 320, a second gate electrode 330, a second source electrode 340 and a second drain electrode 350.

The second semiconductor pattern 310 may include a semiconductor material. The second semiconductor pattern 310 may include a material different from the first semiconductor pattern 210. For example, the second semiconductor pattern 310 may include an oxide semiconductor, such as IGZO. The second semiconductor pattern 310 may be disposed on a layer different from the first semiconductor pattern 210. For example, a separation insulating layer 130 may be disposed on the first interlayer insulating layer 120, and the second semiconductor pattern 310 may be disposed on the separation insulating layer 130. The separation insulating layer 130 may include an insulating material. For example, the separation insulating layer 130 may include an inorganic insulating material, such as silicon oxide (SiO). The separation insulating layer 130 may be thicker than the first interlayer insulating layer 120. Thus, in the display apparatus according to the embodiment of the present disclosure, the damage of the first semiconductor pattern 210 due to a process of forming the second semiconductor pattern 310 may be prevented.

The second semiconductor pattern 310 may have the same structure as the first semiconductor pattern 210. For example, the second semiconductor pattern 310 may include a second source region, a second channel region and a second drain region. The second channel region may be disposed between the second source region and the second drain region. The second source region and the second drain region may have a resistance lower than the second channel region. For example, the second source region and the second drain region may include a conductorized region of an oxide semiconductor.

The second gate insulating layer 320 may be disposed on the second semiconductor pattern 310. The second gate insulating layer 320 may cover the second semiconductor pattern 310, partially. For example, the second gate insulating layer 320 may be disposed on the second channel region of the second semiconductor pattern 310. The second source region and the second drain region of the second semiconductor pattern 310 may be disposed outside the second gate insulating layer 320. The second gate insulating layer 320 may include an insulating material. For example, the second gate insulating layer 320 may include an inorganic insulating material, such as silicon oxide (SiO).

The second gate electrode 330 may be disposed on the second gate insulating layer 320. For example, the second gate electrode 330 may overlap the second channel region of the second semiconductor pattern 310. The second gate electrode 330 may include a conductive material. For example, the second gate electrode 330 may include a metal, such as aluminum (Al), titanium (Ti), copper (Cu), chrome (Cr), molybdenum (Mo) and tungsten (W). The second gate electrode 330 may be insulated from the second semiconductor pattern 310 by the second gate insulating layer 320. For example, the second channel region of the second semiconductor pattern 310 may have an electrical conductivity corresponding to a voltage applied to the second gate electrode 330.

The second source electrode 340 may include a conductive material. For example, the second source electrode 340 may include a metal, such as aluminum (Al), titanium (Ti), copper (Cu), chrome (Cr), molybdenum (Mo) and tungsten (W). The second source electrode 340 may include a material different from the second gate electrode 330. The second source electrode 340 may be disposed on a layer different from the second gate electrode 330. For example, a second interlayer insulating layer 140 may be disposed on the second gate electrode 330, and the second source electrode 340 may be disposed on the second interlayer insulating layer 140. The second interlayer insulating layer 140 may include an insulating material. For example, the second interlayer insulating layer 140 may include an inorganic insulating material, such as silicon oxide (SiO) and silicon nitride (SiN). The second interlayer insulating layer 140 may extend beyond the second semiconductor pattern 310 and the second gate electrode 330. For example, a side of the second semiconductor pattern 310 and a side of the second gate electrode 330 may be covered by the second interlayer insulating layer 140. The second source electrode 340 may be insulated from the second gate electrode 330.

The second source electrode 340 may include the same material as the first source electrode 240 and the first drain electrode 250. The first source electrode 240 and the first drain electrode 250 may be disposed on the same layer as the second source electrode 340. For example, the first source electrode 240 and the first drain electrode 250 may be disposed on the second interlayer insulating layer 140. The first source contact hole SC1 and the first drain contact hole may penetrate the separation insulating layer 130 and the second interlayer insulating layer 140.

The second source electrode 340 may be electrically connected to the second source region of the second semiconductor pattern 310. For example, the second interlayer insulating layer 140 may include a second source contact hole partially exposing the second source region of the second semiconductor pattern 310. The second source electrode 340 may be in direct contact with the second source region of the second semiconductor pattern 310 through the second source contact hole. A vertical depth of the second source contact hole may be the same as a thickness of the second interlayer insulating layer 140. For example, the second source region of the second semiconductor pattern 310 may be in contact with a bottom surface of the second source electrode 340.

The second drain electrode 350 may include a conductive material. For example, the second drain electrode 350 may include a metal, such as aluminum (Al), titanium (Ti), copper (Cu), chrome (Cr), molybdenum (Mo) and tungsten (W). The second drain electrode 350 may be insulated from the second gate electrode 330. For example, the second drain electrode 350 may be disposed on a layer different from the second gate electrode 330. The second drain electrode 350 may be disposed on the same layer as the second source electrode 340. For example, the second drain electrode 350 may be disposed on the second interlayer insulating layer 140. The second drain electrode 350 may include a material different from the second gate electrode 330. For example, the second drain electrode 350 may include the same material as the second source electrode 340.

The second drain electrode 350 may be electrically connected to the second drain region of the second semiconductor pattern 310. For example, the second interlayer insulating layer 140 may include a second drain contact hole partially exposing the second drain region of the second semiconductor pattern 310. The second drain electrode 350 may be in direct contact with the second drain region of the second semiconductor pattern 310 through the second drain contact hole. A vertical depth of the second drain contact hole may be the same as the vertical depth of the second source contact hole. For example, the vertical depth of the second drain contact hole may be the same as the thickness of the second interlayer insulating layer 140. The second drain region of the second semiconductor pattern 310 may be in contact with a bottom surface of the second drain electrode 350.

The switching thin film transistor 200 of each driving circuit may transmit the data signal to the driving thin film transistor 300 of the corresponding driving circuit according to the gate signal. For example, in each pixel area PA, the first gate electrode 230 of the switching thin film transistor 200 may be electrically connected to one of the gate lines GL, and the first source electrode 240 of the switching thin film transistor 200 may be electrically connected to one of the data lines. The gate lines GL and the data lines may be formed by a process of forming the switching thin film transistor 200 in each pixel area PA. For example, the gate lines GL may be formed on the same layer as the first gate electrode 230 of each driving circuit, and the data lines may be formed on the same layer as the first source electrode 240 and the first drain electrode 250 of each driving circuit. The gate lines GL may be disposed between the first gate insulating layer 220 and the first interlayer insulating layer 120 of each pixel area PA. For example, the gate lines GL may include the same material as the first gate electrode 230 of each driving circuit. The data lines may be disposed on the second interlayer insulating layer 140. For example, the data lines may include the same material as the first source electrode 240 and the first drain electrode 250.

The driving thin film transistor 300 of each driving circuit may generate the driving current corresponding to the data signal. For example, in each pixel area PA, the second gate electrode 330 of the driving thin film transistor 300 may be electrically connected to the first drain electrode 250 of the switching thin film transistor 200, and the second source electrode 340 of the driving thin film transistor 300 may be electrically connected to one of power voltage supply lines. The power voltage supply lines may be formed by a process of forming the driving thin film transistor 300 in each pixel area PA. For example, the power voltage supply lines may be disposed on the same layer as the second source electrode 340 and the second drain electrode 350 of each driving circuit. The power voltage supply lines may be disposed on the second interlayer insulating layer 140. For example, the power voltage supply lines may be disposed on the same layer as the data lines. The power voltage supply lines may be spaced away from the data lines. The power voltage supply lines may include the same material as the second source electrode 340 and the second drain electrode 350 of each driving circuit. For example, the power voltage supply lines may include the same material as the data lines.

A buffer insulating layer 110 may be disposed between the device substrate 100 and the driving circuit of each pixel area PA. The buffer insulating layer 110 may prevent pollution due to the device substrate 100 in a process of forming the switching thin film transistor 200 and the driving thin film transistor 300 of each driving circuit. For example, the buffer insulating layer 110 may extend along an upper surface of the device substrate 100 toward the switching thin film transistor 200 and the driving thin film transistor 300 of each driving circuit. The buffer insulating layer 110 may include an insulating material. For example, the buffer insulating layer 110 may include an inorganic insulating material, such as silicon oxide (SiO) and silicon nitride (SiN). The buffer insulating layer 110 may have a multilayer structure. For example, the buffer insulating layer 110 may have a stacked structure of a lower buffer layer 111 and an upper buffer layer 112. The lower buffer layer 111 may be disposed between the device substrate 100 and the upper buffer layer 112. For example, a lower surface of the first semiconductor pattern 210 may be in direct contact with the upper buffer layer 112 in each pixel area PA. The upper buffer layer 112 may include a material different from the lower buffer layer 111. The separation insulating layer 130 may extend on the upper buffer layer 112 of the bending area BA.

A light-blocking pattern 410 may be disposed in each pixel area PA. The light-blocking pattern 410 may include a material capable of blocking light. The light-blocking pattern 410 may include a conductive material. For example, the light-blocking pattern 410 may include a metal, such as aluminum (Al), titanium (Ti), silver (Ag), copper (Cu), chrome (Cr), molybdenum (Mo) and tungsten (W). The light-blocking pattern 410 may be disposed between the device substrate 100 and the second semiconductor pattern 310 of the driving thin film transistor 300. For example, the second semiconductor pattern 310 of the driving thin film transistor 300 may overlap a portion of the light-blocking pattern 410. Thus, in the display apparatus according to the embodiment of the present disclosure, external light travelling in a direction toward the second semiconductor pattern 310 of the driving thin film transistor 300 may be blocked by the light-blocking pattern 410. Therefore, in the display apparatus according to the embodiment of the present disclosure, a change in the characteristics of the driving thin film transistor 300 due to the external light may be prevented.

The light-blocking pattern 410 may be disposed close to the device substrate 100. The first gate electrode 230 of the switching thin film transistor 200 may be insulated from the light-blocking pattern 410. The light-blocking pattern 410 may be disposed on a layer different from the first gate electrode 230 of the switching thin film transistor 200. For example, the light-blocking pattern 410 may be disposed between the device substrate 100 and the buffer insulating layer 110. The light-blocking pattern 410 may be in direct contact with the upper surface of the device substrate 100. The light-blocking pattern 410 may include a material different from the first gate electrode 230. Thus, in the display apparatus according to the embodiment of the present disclosure, the material of the light-blocking pattern 410 may be selected, regardless of the operating characteristics of the switching thin film transistor 200. That is, in the display apparatus according to the embodiment of the present disclosure, the function of the light-blocking pattern 410 may be maximized, without degrading of the characteristics of the switching thin film transistor 200. Therefore, in the display apparatus according to the embodiment of the present disclosure, the change in the characteristics of the switching thin film transistor 200 due to the external light may be effectively prevented.

The light-blocking pattern 410 of each pixel area PA may be separated from the light-blocking pattern 410 of adjacent pixel area PA. For example, the light-blocking pattern 410 of each pixel area PA may have a shape of island. The light-blocking pattern 410 of each pixel area PA may be spaced away from the light-blocking pattern 410 of adjacent pixel area PA. Thus, in the display apparatus according to the embodiment of the present disclosure, the signal delay due to a parasitic capacitance between the light-blocking pattern 410 and the gate lines GL and/or the data lines may be prevented.

An intermediate electrode 600 electrically connected to the light-blocking pattern 410 may be disposed in each pixel area PA. The intermediate electrode 600 may include a conductive material. For example, the intermediate electrode 600 may include a metal, such as aluminum (Al), titanium (Ti), copper (Cu), chrome (Cr), molybdenum (Mo) and tungsten (W). The intermediate electrode 600 may be connected to one of signal wirings, such as the gate lines GL, the data lines DL (see FIG. 29) and the power voltage supply lines. For example, the intermediate electrode 600 may be electrically connected to the power voltage supply lines, and the power voltage may be applied to the light-blocking pattern 410 by the intermediate electrode 600. Thus, in the display apparatus according to the embodiment of the present disclosure, blocking the external light by the light-blocking pattern 410 may be effective performed.

The intermediate electrode 600 may be disposed on the same layer as the corresponding signal wiring. For example, the intermediate electrode 600 may be disposed on the second interlayer insulating layer 140. The intermediate electrode 600 may be disposed on the same layer as the first source electrode 240, the first drain electrode 250, the second source electrode 340 and the second drain electrode 350. For example, the intermediate electrode 600 may include the same material as the first source electrode 240, the first drain electrode 250, the second source electrode 340 and the second drain electrode 350. The intermediate electrode 600 may be formed simultaneously with the first source electrode 240, the first drain electrode 250, the second source electrode 340 and the second drain electrode 350. Thus, in the display apparatus according to the embodiment of the present disclosure, a process of forming the intermediate electrode 600 may be simplified.

The intermediate electrode 600 may be electrically connected to the light-blocking pattern 410 through an intermediate contact hole BC. For example, the intermediate contact hole BC may penetrate the buffer insulating layer 110, the first gate insulating layer 220, the first interlayer insulating layer 120, the separation insulating layer 130 and the second interlayer insulating layer 140. A vertical depth of the intermediate contact hole may be greater than the vertical depth h1 of the first source contact hole SC1. For example, the intermediate contact hole BC may include a first intermediate hole BC1 and the second intermediate hole BC2 disposed in the first intermediate hole BC1.

The first intermediate hole BC1 may partially expose the upper buffer layer 112. For example, the first intermediate hole BC1 may penetrate the first gate insulating layer 220, the first interlayer insulating layer 120, the separation insulating layer 130 and the second interlayer insulating layer 140. A vertical depth h2 of the first intermediate hole BC1 may be the same as the vertical depth h1 of the first source contact hole SC1. For example, a bottom surface Cb of the first intermediate hole BC1 toward the device substrate 100 on the light-blocking pattern 410 may be disposed closer to the device substrate 100 than an upper surface of the upper buffer layer 112 opposite to the device substrate 100. The first intermediate hole BC1 may be formed simultaneously with the first source contact hole SC1. For example, a first distance d1 between the bottom surface Sb of the first source contact hole SC1 and the lower surface of the first semiconductor pattern 210 may be the same as a second distance d2 between the bottom surface Cb of the first intermediate hole BC1 and the upper surface of the upper buffer layer 112 on the light-blocking pattern 410.

The second intermediate hole BC2 may partially expose a portion of the light-blocking pattern 410 overlapping with the first intermediate hole BC1. For example, the second intermediate hole BC2 may penetrate a portion of the upper buffer layer 112 and the lower buffer layer 111. A vertical depth h3 of the second intermediate hole BC2 may be smaller than a vertical depth h2 of the first intermediate hole BC1.

A capacitor upper electrode 420 may be disposed between the light-blocking pattern 410 and the second semiconductor pattern 310 of each pixel area PA. The capacitor upper electrode 420 may overlap a portion of the light-blocking pattern 410. For example, the light-blocking pattern 410 and the capacitor upper electrode 420 may consist of a storage capacitor 400 of the driving circuit. That is, in the display apparatus according to the embodiment of the present disclosure, the light-blocking pattern 410 may function as a capacitor lower electrode of the storage capacitor 400. Thus, in the display apparatus according to the embodiment of the present disclosure, the process efficiency may be improved.

The capacitor upper electrode 420 may include a conductive material. For example, the capacitor upper electrode 420 may include a metal, such as aluminum (Al), titanium (Ti), copper (Cu), chrome (Cr), molybdenum (Mo) and tungsten (W). The capacitor upper electrode 420 may be disposed on a layer different from the first gate electrode 230 of the switching thin film transistor 200. For example, the capacitor upper electrode 420 may be disposed between the first interlayer insulating layer 120 and the separation insulating layer 130. The capacitor upper electrode 420 may include a material different from the first gate electrode 230. Thus, in the display apparatus according to the embodiment of the present disclosure, the storage capacitor 400 may be configured, regardless of the operation characteristics of the switching thin film transistor 200. Therefore, in the display apparatus according to the embodiment of the present disclosure, the operation characteristics of each driving circuit may be improved.

A first planarization layer 150 and a second planarization layer 160 may be sequentially stacked on the driving circuit of each pixel area PA. For example, the first planarization layer 150 may be disposed between the second interlayer insulating layer 140 and the second planarization layer 160. The first source electrode 240, the first drain electrode 250, the second source electrode 340, the second drain electrode 350 and the intermediate electrode 600 of each pixel area PA may be covered by the first planarization layer 150. The first planarization layer 150 and the second planarization layer 160 may remove a thickness difference due to the driving circuit of each pixel area PA. For example, an upper surface of the second planarization layer 160 opposite to the device substrate 100 may be a flat surface. The first planarization layer 150 and the second planarization layer 160 may include an insulating material. The first planarization layer 150 and the second planarization layer 160 may include a material different from the second interlayer insulating layer 140. For example, the first planarization layer 150 and the second planarization layer 160 may include an organic insulating material. The second planarization layer 160 may include a material different from the first planarization layer 150.

A light-emitting device 500 may be disposed on the second planarization layer 160 of each pixel area PA. The light-emitting device 500 may emit light displaying a specific color. For example, the light-emitting device 500 may include a first electrode 510, a light-emitting layer 520 and a second electrode 530, which are sequentially stacked.

The first electrode 510 may include a conductive material. The first electrode 510 may include a material having a high reflectance. For example, the first electrode 510 may include a metal, such as aluminum (Al) and silver (Ag). The first electrode 510 may have a multi-layer structure. For example, the first electrode 510 may have a structure in which a reflective electrode made of a metal is interposed between transparent electrodes made of transparent conductive material, such as ITO and IZO.

The light-emitting layer 520 may generate light having luminance corresponding to a voltage difference between the first electrode 510 and the second electrode 530. For example, the light-emitting layer 520 may include an emission material layer (EML) having an emission material. The emission material may include an organic material, an inorganic material or a hybrid material. For example, the display apparatus according to the embodiment of the present disclosure may be an organic light-emitting display apparatus including an organic emission material. The light-emitting layer 520 may have a multi-layer structure. For example, the light-emitting layer 520 may further include at least one of a hole injection layer (HIL), a hole transport layer (HTL), an electron transport layer (ETL) and an electron injection layer (EIL). Thus, in the display apparatus according to the embodiment of the present disclosure, the emission efficiency of the light-emitting layer 520 in each pixel area PA may be improved.

The second electrode 530 may include a conductive material. The second electrode 530 may include a material different from the first electrode 510. The second electrode 530 may be a transparent electrode having higher transmittance than the first electrode 510. Thus, in the display apparatus according to the embodiment of the present disclosure, the light generated by the light-emitting layer 520 of each pixel area PA may be emitted to the outside through the second electrode 530 of the corresponding pixel area PA.

The light-emitting device 500 of each pixel area PA may be electrically connected to the driving circuit of the corresponding pixel area PA. For example, the first planarization layer 150 and the second planarization layer 160 may include electrode contact holes partially exposing the second drain electrode 350 of each pixel area PA. The first electrode 510 of each pixel area PA may be electrically connected to the second drain electrode 350 of the driving thin film transistor 300 in the corresponding pixel area PA through one of the electrode contact holes. Thus, in the display apparatus according to the embodiment of the present disclosure, the driving current generated by the driving circuit of each pixel area PA may be applied to the light-emitting device 500 of the corresponding pixel area PA.

A first connection electrode 710 connecting between the second drain electrode 350 of the driving thin film transistor 300 and the first electrode 510 of the light-emitting device 500 in each pixel area PA may be disposed between the first planarization layer 150 and the second planarization layer 160 of the corresponding pixel area PA. For example, the first connection electrode 710 of each pixel area PA may be connected to the second drain electrode 350 of the corresponding pixel area PA by penetrating the first planarization layer 150, and the first electrode 510 of each pixel area PA may be connected to the first connection electrode 710 of the corresponding pixel area PA by penetrating the second planarization layer 160. Thus, in the display apparatus according to the embodiment of the present disclosure, the light-emitting device 500 of each pixel area PA may be stably connected to the driving thin film transistor 300 of the corresponding pixel area PA. The first connection electrode 710 may include a conductive material. For example, the first connection electrode 710 may include a metal, such as aluminum (Al), titanium (Ti), copper (Cu), chrome (Cr), molybdenum (Mo) and tungsten (W).

A second connection electrode 720 connected to the intermediate electrode 600 of each pixel area PA may be disposed between the first planarization layer 150 and the second planarization layer 160 of the corresponding pixel area PA. The second connection electrode 720 may include a conductive material. For example, the second connection electrode 720 may include a metal, such as such as aluminum (Al), titanium (Ti), copper (Cu), chrome (Cr), molybdenum (Mo) and tungsten (W). The second connection electrode 720 may include the same material as the first connection electrode 710. For example, the second connection electrode 720 may be formed simultaneously with the first connection electrode 710. The intermediate electrode 600 of each pixel area PA may be connected to one of the signal wirings through the second connection electrode 720 of the corresponding pixel area PA. Thus, in the display apparatus according to the embodiment of the present disclosure, the intermediate electrode 600 in each pixel area PA may be connected to one of the signal wirings by bypassing connection lines connecting between the switching thin film transistor 200, the driving thin film transistor 300 and the storage capacitor 400. Therefore, in the display apparatus according to the embodiment of the present disclosure, the degree of freedom for the configuration of the driving circuit in each pixel area PA may be improved.

The first electrode 510 of each pixel area PA may be spaced away from the first electrode 510 of adjacent pixel area PA. For example, a bank insulating layer 170 may be disposed on the second planarization layer 160 between adjacent first electrodes 510. The bank insulating layer 170 may include an insulating material. For example, the bank insulating layer 170 may include an organic insulating material. The bank insulating layer 170 may include a material different from the second planarization layer 160. The first electrode 510 of each pixel area PA may be insulated from the first electrode 510 of adjacent pixel area PA by the bank insulating layer 170. For example, the bank insulating layer 170 may cover an edge of each first electrode 510. The light-emitting layer 520 and the second electrode 530 of each pixel area PA may be sequentially stacked on a portion of the corresponding first electrode 510 exposed by the bank insulating layer 170. The bank insulating layer 170 may be in direct contact with the second planarization layer 160 between adjacent first electrodes 510. Thus, in the display apparatus according to the embodiment of the present disclosure, the light-emitting device 500 of each pixel area PA may be controlled, independently.

The light-emitting device 500 of each pixel area PA may emit light displaying a color different from the light-emitting device 500 of adjacent pixel area PA. For example, the light-emitting layer 520 of each pixel area PA may be spaced away from the light-emitting layer 520 of adjacent pixel area PA. The light-emitting layer 520 of each pixel area PA may include an end on the bank insulating layer 170 of the corresponding pixel area PA. The light-emitting layer 520 of each pixel area PA may be formed by a process different from the light-emitting layer 520 of adjacent pixel area PA. For example, the light-emitting layer 520 of each pixel area PA may be formed using a fine metal mask (FMM). A spacer 180 may be disposed on the bank insulating layer 170. The spacer 180 may include an insulating material. The fine metal mask used in a process of forming the light-emitting layer 520 of each pixel area PA may be supported by the spacer 180. For example, the light-emitting layer 520 of each pixel area PA may be spaced away from the spacer 180. Thus, in the display apparatus according to the embodiment of the present disclosure, the damage of the bank insulating layer 170 and the light-emitting layer 520 of adjacent pixel area PA in a process of forming the light-emitting layer 520 in each pixel area PA may be prevented.

A voltage applied to the second electrode 530 of each pixel area PA may be the same as a voltage applied to the second electrode 530 of adjacent pixel area PA. For example, the second electrode 530 of each pixel area PA may be electrically connected to the second electrode 530 of adjacent pixel area PA. The second electrode 530 of each pixel area PA may include the same material as the second electrode 530 of adjacent pixel area PA. For example, the second electrode 530 of each pixel area PA may be in direct contact with the second electrode 530 of adjacent pixel area PA. The second electrode 530 of each pixel area PA may be formed simultaneously with the second electrode 530 of adjacent pixel area PA. For example, the second electrode 530 of each pixel area PA may extend on the bank insulating layer 170 and the spacer 180. Thus, the display apparatus according to the embodiment of the present disclosure may control the luminance of the light emitted from the light-emitting device 500 of each pixel area PA through the data signal.

As shown in FIGS. 2 and 3C, the buffer insulating layer 110, the first gate insulating layer 220, the first interlayer insulating layer 120, the separation insulating layer 130, the second interlayer insulating layer 140, the first planarization layer 150 and the second planarization layer 160 may be disposed on the non-display area NA of the device substrate 100. For example, the buffer insulating layer 110, the first gate insulating layer 220, the first interlayer insulating layer 120, the separation insulating layer 130, the second interlayer insulating layer 140, the first planarization layer 150 and the second planarization layer 160 may extend on the bending area BA of the device substrate 100. A bending open hole OP in which the buffer insulating layer 110, the first gate insulating layer 220, the first interlayer insulating layer 120, the separation insulating layer 130 and the second interlayer insulating layer 140 are removed may be disposed on the bending area BA of the device substrate 100. The first planarization layer 150 and the second planarization layer 160 may extend in the bending open hole OP. For example, the bending open hole OP may be filled by the first planarization layer 150. Thus, in the display apparatus according to the embodiment of the present disclosure, a bending stress caused by bending the bending area BA of the device substrate 100 may be reduced. The bending open hole OP may partially expose the bending area BA of the device substrate 100. For example, the bending open hole OP may include a first bending hole OP1 and a second bending hole OP2 in the first bending hole OP1.

The first bending hole OP1 may partially expose the upper buffer layer 112 of the bending area BA. For example, a vertical depth h4 of the first bending hole OP1 may be the same as a vertical depth h2 of the first intermediate hole BC1. As an example, a vertical depth of the first bending hole OP1 may be greater than or equal to a vertical depth of the intermediate contact hole BC. The upper buffer layer 112 of the bending area BA may include an upper recess region 112r overlapping with the first bending hole OP1. A vertical depth d3 of the upper recess region 112r may be the same as a second distance d2 between the bottom surface Cb of the first intermediate hole BC1 and the upper surface of the upper buffer layer 112. For example, the first bending hole OP1 may be formed simultaneously with the first intermediate hole BC1.

The second bending hole OP2 may partially expose a portion of the device substrate 100 overlapping with the first bending hole OP1. The second bending hole OP2 may penetrate a portion of the upper buffer layer 112 and the lower buffer layer 111. A vertical depth of the second bending hole OP2 may be smaller than a vertical depth of the first bending hole OP1. The vertical depth h5 of the second bending hole OP2 may be different from the vertical depth h3 of the second intermediate hole BC2. For example, the vertical depth h5 of the second bending hole OP2 may be greater than the vertical depth h3 of the second intermediate hole BC2. A substrate recess region 100r overlapping with the second bending hole OP2 may be disposed in the bending area BA of the device substrate 100.

Hereinafter, a method of forming the display apparatus according to the embodiment of the present disclosure will be described with reference to FIGS. 2, 3A to 3C and 4 to 15.

FIGS. 4 to 18 are views sequentially showing a method of forming the display apparatus according to the embodiment of the present disclosure.

Figure 4:
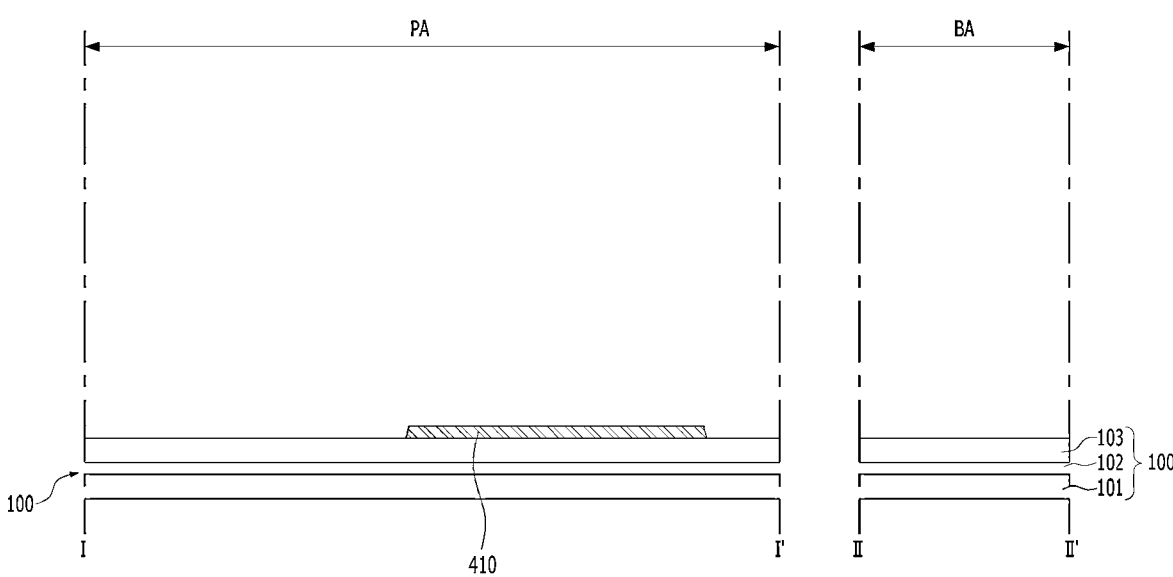

First, the method of forming the display apparatus according to the embodiment of the present disclosure may include a step of preparing a device substrate 100 and a step of forming a light-blocking pattern 410 on a pixel area PA of the device substrate 100, as shown in FIG. 4.

The device substrate 100 may be formed of a flexible material. The device substrate 100 may have a multi-layer structure. For example, the step of preparing the device substrate 100 may include a step of coupling a first substrate layer 101, a substrate insulating layer 102 and a second substrate layer 103. The second substrate layer 103 may be formed of the same material as the first substrate layer 101. For example, the first substrate layer 101 and the second substrate layer 103 may be formed of a polymer material, such as poly-imide (PI). The substrate insulating layer 102 may include an insulating material. For example, the substrate insulating layer 102 may be formed of an inorganic insulating material, such as silicon oxide (SiO) and silicon nitride (SiN).

The light-blocking pattern 410 may include a conductive material. For example, the light-blocking pattern 410 may be formed of a metal, such as aluminum (Al), titanium (Ti), copper (Cu), chrome (Cr), molybdenum (Mo) and tungsten (W). The step of forming the light-blocking pattern 410 may include an etching process using a mask. For example, the step of forming the light-blocking pattern 410 may include a step of forming a conductive material layer on the device substrate 100 and a step of patterning the conductive material layer using a mask.

Figure 5:
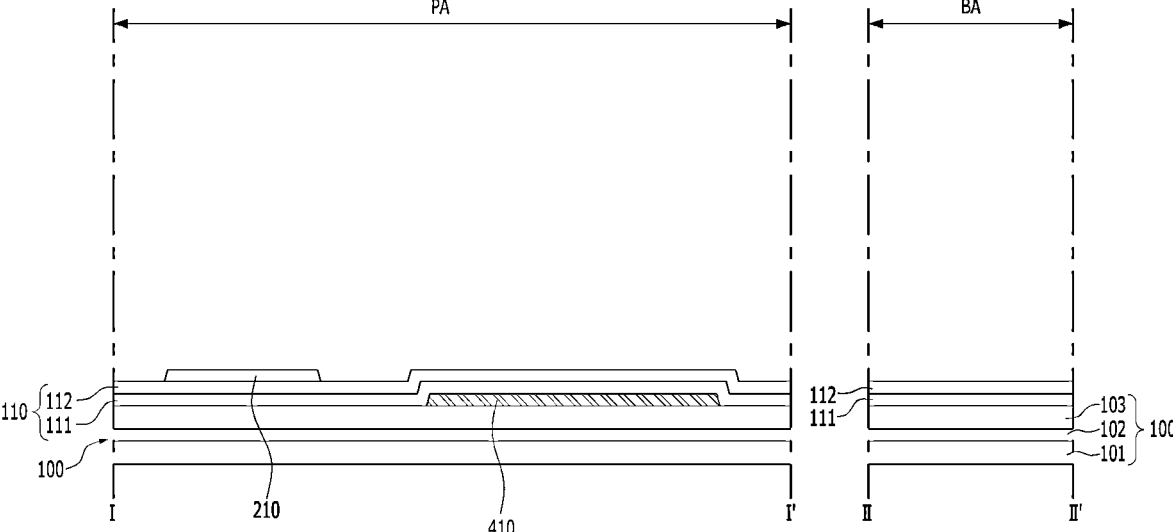

The method of forming the display apparatus according to the embodiment of the present disclosure may include a step of forming a buffer insulating layer 110 on the device substrate 100 in which the light-blocking pattern 410 is formed, and a step of forming a first semiconductor pattern 210 on the buffer insulating layer 110 of a pixel area PA, as shown in FIG. 5.

The buffer insulating layer 110 may be formed of an insulating material. For example, the buffer insulating layer 110 may be formed of an inorganic insulating material, such as silicon oxide (SiO) and silico nitride (SiN). The buffer insulating layer 110 may be formed on the pixel area PA and a bending area BA disposed outside the pixel area PA of the device substrate 100. The buffer insulating layer 110 may have a multi-layer structure. For example, the step of forming the buffer insulating layer 110 may include a step of forming a lower buffer layer 111 on the pixel area PA and the bending area BA of the device substrate 100 in which the light-blocking pattern 410 is formed, and a step of forming an upper buffer layer 112 on the lower buffer layer 111 of the pixel area PA and the bending area BA. The light-blocking pattern 410 may be covered by the lower buffer layer 111. The upper buffer layer 112 may be formed of a material different from the lower buffer layer 111.

The first semiconductor pattern 210 may be formed of a semiconductor material. For example, the first semiconductor pattern 210 may be formed of a low-temperature poly-Si (LTPS). A forming process of the first semiconductor pattern

210 may include a deposition process and a crystallization process. The step of forming the first semiconductor pattern 210 may include an etching process using a mask. For example, the step of forming the first semiconductor pattern 210 may include a step of forming an amorphous silicon layer on the upper buffer layer 112, a step of forming a low-temperature poly-Si layer by crystallizing the amorphous silicon layer at the low-temperature, and a step of patterning the low-temperature poly-Si layer using a mask. The first semiconductor pattern 210 may be spaced away from the light-blocking pattern 410. For example, the first semiconductor pattern 210 may be formed outside the light-blocking pattern 410.

Figures 6, 7:
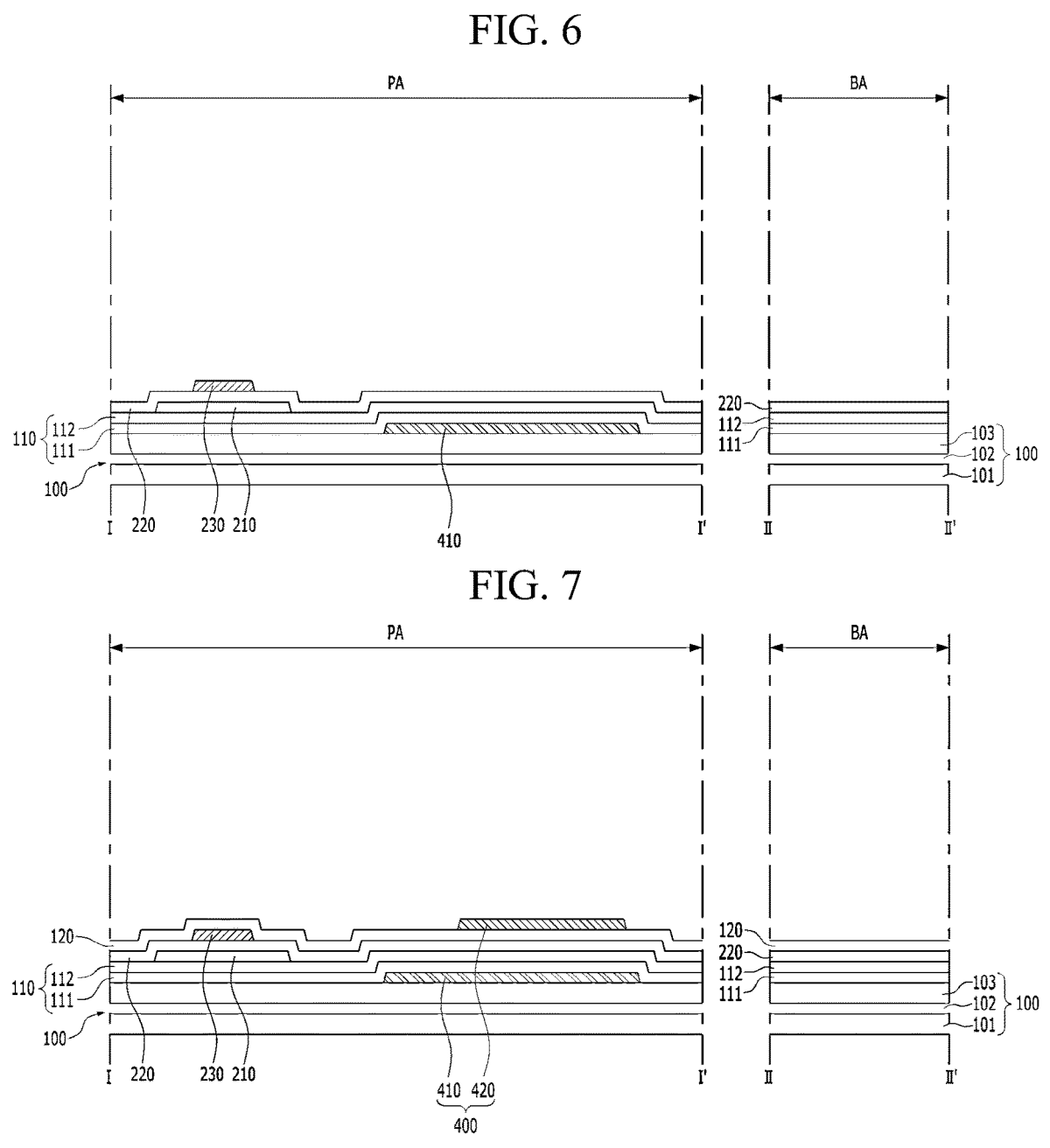

The method of forming the display apparatus according to the embodiment of the present disclosure may include a step of forming a first gate insulating layer 220 on the device substrate 100 in which the first semiconductor pattern 210 is formed, and a step of forming a first gate electrode 230 on the first gate insulating layer 220 of the pixel area PA, as shown in FIG. 6.

The first gate insulating layer 220 may be formed of an insulating material. For example, the first gate insulating layer 220 may be formed of an inorganic insulating material, such as silicon oxide (SiO) and silicon nitride (SiN). The first gate insulating layer 220 may be formed on the pixel area PA and the bending area BA of the device substrate 100. For example, the first gate insulating layer 220 may cover the buffer insulating layer 110 of the bending area BA and the first semiconductor pattern 210.

The first gate electrode 230 may include a conductive material. For example, the first gate electrode 230 may be formed of a metal, such as aluminum (Al), titanium (Ti), copper (Cu), chrome (Cr), molybdenum (Mo) and tungsten (W). The first gate electrode 230 may be formed of a material different from the light-blocking pattern 410. The step of forming the first gate electrode 230 may include an etching process using a mask. For example, the step of forming the first gate electrode 230 may include a step of forming a conductive material layer on the first gate insulating layer 220 and a step of patterning the conductive material layer using a mask.

The first gate electrode 230 may be formed on a first channel region of the first semiconductor pattern 210. The first channel region of the first semiconductor pattern 210 may be disposed between a first source region and a first drain region of the first semiconductor pattern 210. The first source region and the first drain region of the first semiconductor pattern 210 may have a resistance lower than the first channel region of the first semiconductor pattern 210. For example, the first source region, the first channel region and the first drain region of the first semiconductor pattern 210 may be formed by a doping process with conductive impurities.

The first source region, the first channel region and the first drain region of the first semiconductor pattern 210 may be formed using the first gate electrode 230. For example, a step of forming the first source region, the first drain region and the first channel region in the first semiconductor pattern 210 may include a step of doping both end portions of the first semiconductor pattern 210 with conductive impurities using the first gate electrode 230 formed on a central portion of first semiconductor pattern 210. Thus, the method of forming the display apparatus according to the embodiment of the present disclosure may form the first source region, the first channel region and the first drain region in the first semiconductor pattern 210, without using additional mask for the doping process with conductive impurities. Therefore, in the method of forming the display apparatus according to the embodiment of the present disclosure, the process efficiency may be improved.

The method of forming the display apparatus according to the embodiment of the present disclosure may include a step of forming a first interlayer insulating layer 120 on the device substrate 100 in which the first gate electrode 230 is formed, and a step of forming a capacitor upper electrode 420 on the first interlayer insulating layer 120 of the pixel area PA, as shown in FIG. 7.

The first interlayer insulating layer 120 may include an insulating material. For example, the first interlayer insulating layer 120 may be formed of an inorganic insulating material, such as silicon oxide (SiO) and silicon nitride (SiN). The first interlayer insulating layer 120 may be formed on the pixel area PA and the bending area BA of the device substrate 100. For example, the first gate insulating layer 220 of the bending area BA and the first gate electrode 230 may be covered by the first interlayer insulating layer 120.

The capacitor upper electrode 420 may be formed of a conductive material. For example, the capacitor upper electrode 420 may be formed of a metal, such as aluminum (Al), titanium (Ti), copper (Cu), chrome (Cr), molybdenum (Mo) and tungsten (W). The capacitor upper electrode 420 may be formed of a material different from the first gate electrode 230. The step of forming the capacitor upper electrode 420 may include an etching process using a mask. For example, the step of forming the capacitor upper electrode 420 may include a step of forming a conductive material layer on the first interlayer insulating layer 120 and a step of patterning the conductive material layer using a mask.

The capacitor upper electrode 420 may be formed on the light-blocking pattern 410. For example, the capacitor upper electrode 420 may overlap a portion of the light-blocking pattern 410. The light-blocking pattern 410 and the capacitor upper electrode 420 may constitute a storage capacitor 400. For example, the light-blocking pattern 410 may function as a capacitor lower electrode of the storage capacitor 400.

Figures 8, 9:
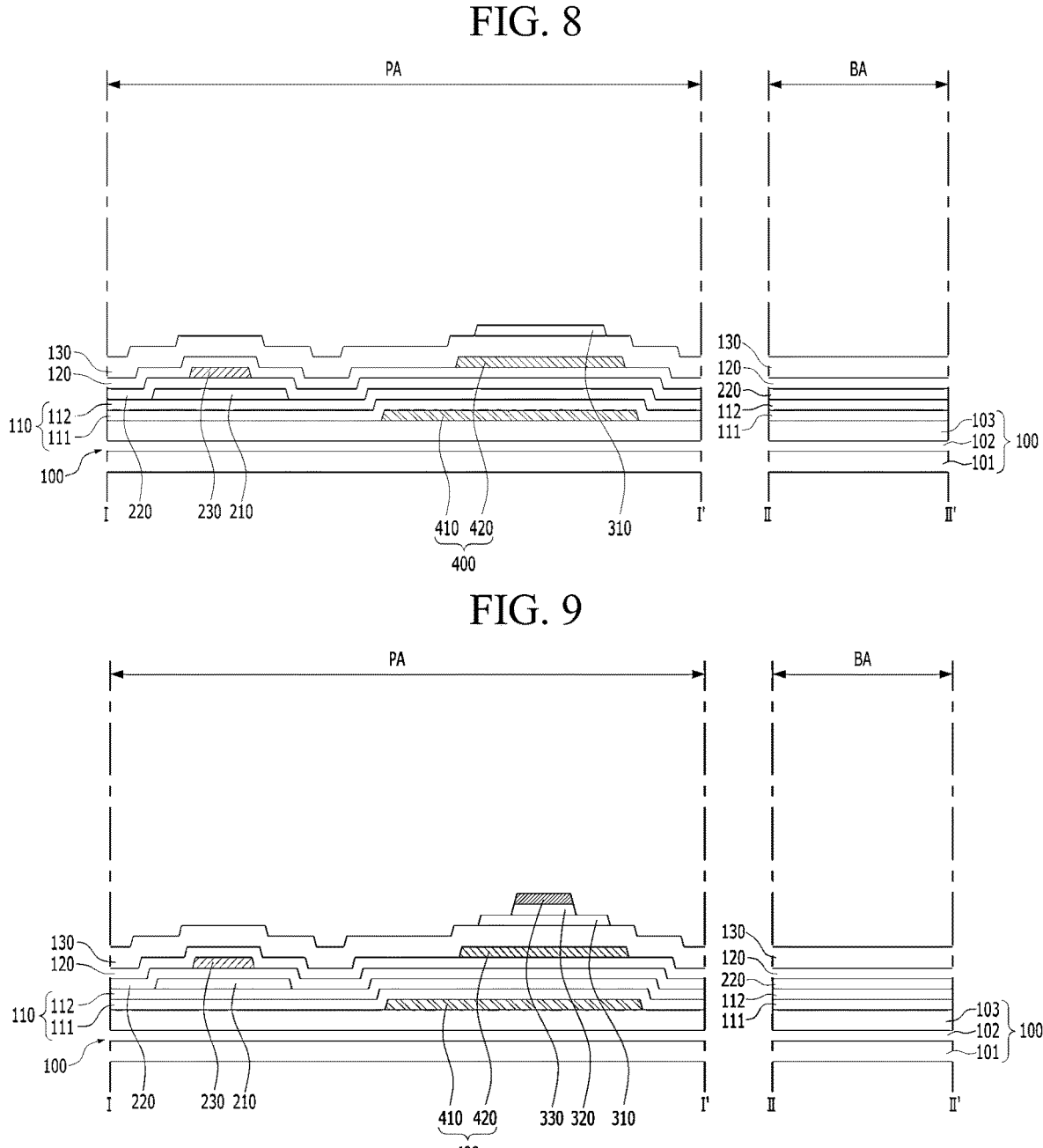

The method of forming the display apparatus according to the embodiment of the present disclosure may include a step of forming a separation insulating layer 130 on the device substrate 100 in which the capacitor upper electrode 420 is formed, and a step of forming a second semiconductor pattern 310 on the separation insulating layer 130 of the pixel area PA, as shown in FIG. 8.

The separation insulating layer 130 may be formed of an insulating material. For example, the separation insulating layer 130 may be formed of an inorganic insulating material, such as silicon oxide (SiO). The separation insulating layer 130 may be formed as thicker than the first interlayer insulating layer 120. The separation insulating layer 130 may be formed on the pixel area PA and the bending area BA of the device substrate 100. For example, the first interlayer insulating layer 120 of the bending area BA and the capacitor upper electrode 420 may be covered by the separation insulating layer 130.

The second semiconductor pattern 310 may be formed of a semiconductor material. The second semiconductor pattern 310 may be formed of a material different from the first semiconductor pattern 210. For example, the second semiconductor pattern 310 may be formed of an oxide semiconductor, such as IGZO. The step of forming the second semiconductor pattern 310 may include an etching process using a mask. For example, the step of forming the second semiconductor pattern 310 may include a step of forming an oxide semiconductor material layer on the separation insulating layer 130, and a step of patterning the oxide semiconductor material layer using a mask.

The second semiconductor pattern 310 may be formed on the capacitor upper electrode 420. For example, the second semiconductor pattern 310 may overlap a portion of the light-blocking pattern 410. Thus, in the method of forming the display apparatus according to the embodiment of the present disclosure, the light travelling in a direction toward the second semiconductor pattern 310 passing though the device substrate 100 may be blocked by the light-blocking pattern 410.

The method of forming the display apparatus according to the embodiment of the present disclosure may include a step of forming a second gate insulating layer 320 on a portion of the second semiconductor pattern 310, and a step of forming a second gate electrode 330 on the second gate insulating layer 320, as shown in FIG. 9.

The second gate insulating layer 320 may be formed of an insulating material. For example, the second gate insulating layer 320 may be formed of an inorganic insulating material, such as silicon oxide (SiO). The second gate insulating layer 320 may expose a portion of the second semiconductor pattern 310. For example, a second source region and a second drain region of the second semiconductor pattern 310 may be disposed outside the second gate insulating layer 320. The second semiconductor pattern 310 may include a second channel region between the second source region and the second drain region. The second source region and the second drain region of the second semiconductor pattern 310 may have a resistance lower than the second channel region of the second semiconductor pattern 310. For example, the second source region and the second drain region of the second semiconductor pattern 310 may include a conductorized region of an oxide semiconductor. For example, the second channel region of the second semiconductor pattern 310 may be a region of an oxide semiconductor which is not conductorized. The second gate insulating layer 320 may overlap the second channel region of the second semiconductor pattern 310.

The second gate electrode 330 may be formed to overlap with the second gate insulating layer 320. For example, the second gate electrode 320 may overlap the second channel region of the second semiconductor pattern 310. The second gate electrode 330 may be formed of a conductive material. For example, the second gate electrode 330 may be formed of a metal, such as aluminum (Al), titanium (Ti), copper (Cu), chrome (Cr), molybdenum (Mo) and tungsten (W).

The second gate insulating layer 320 and the second gate electrode 330 may be formed by a single mask process. For example, the step of forming the second gate insulating layer 320 and the step of forming the second gate electrode 330 may include a step of forming an insulating material layer on the device substrate 100 in which the second semiconductor pattern 310 is formed, a step of forming a conductive material layer on the insulating material layer, a step of forming the second gate electrode 330 by patterning the conductive material layer through an etching process using a mask, and a step of forming the second gate insulating layer 320 by pattering the insulating material layer using the second gate electrode 330 as a mask. A side of the second gate insulating layer 320 may be vertically aligned with a side of the second gate electrode 330. For example, the side of the second gate electrode 330 may be continuously connected with the side of the second gate insulating layer 320.

The second source region, the second channel region and the second drain region of the second semiconductor pattern 310 may be formed by a process of forming the second gate insulating layer 320. For example, the step of forming the second source region, the second channel region and the second drain region in the second semiconductor pattern 310 may include a step of conductorizing a portion of the second semiconductor pattern 310 exposed by the second gate insulating layer 320 using an etchant used in a patterning process of the second gate insulating layer 320.

Figures 10, 11:
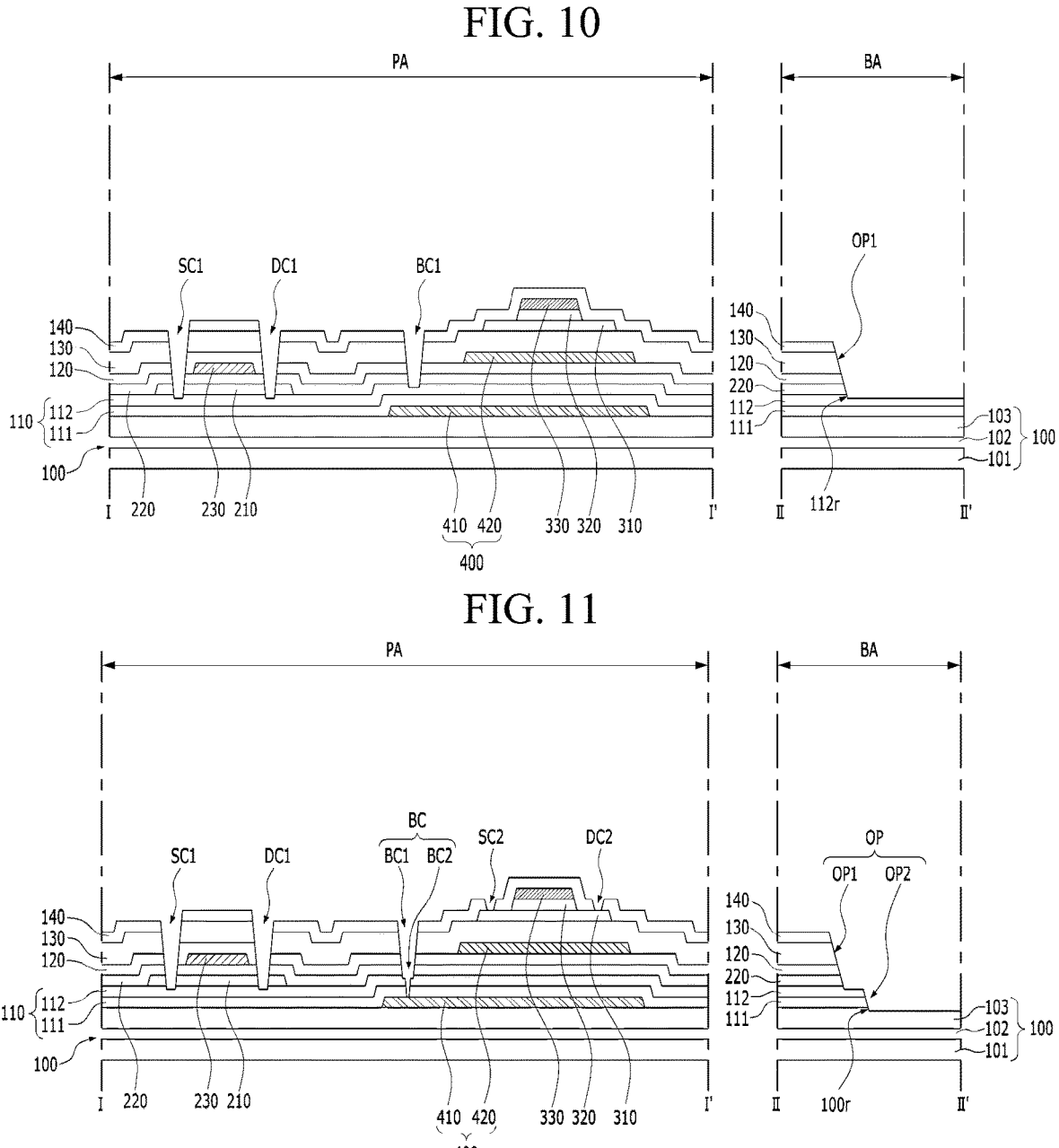

The method of forming the display apparatus according to the embodiment of the present disclosure may include a step of forming a second interlayer insulating layer 140 on the device substrate 100 in which the second gate electrode 330 is formed, and a step of forming a first source contact hole SC1, a first drain contact hole DC1, a first intermediate hole BC1 and a first bending hole OP1 on the device substrate 100 in which the second interlayer insulating layer 140 is formed, as shown in FIG. 10.

The second interlayer insulating layer 140 may be formed of an insulating material. For example, the second interlayer insulating layer 140 may be formed of an inorganic insulating material, such as silicon oxide (Sic). The second interlayer insulating layer 140 may be formed on the pixel area PA and the bending area BA of the device substrate 100. For example, the second interlayer insulating layer 140 may cover the separation insulating layer 130 of the bending area BA and the second semiconductor pattern 310, the second gate insulating layer 320 and the second gate electrode 330 of the pixel area PA.

The first source contact hole SC1 and the first drain contact hole DC1 may be formed in the pixel area PA. The first source contact hole SC1 may partially expose the first source region of the first semiconductor pattern 210, and the first drain contact hole DC1 may partially expose the first drain region of the first semiconductor pattern 210. For example, each of the first source contact hole SC1 and the first drain contact hole DC1 may penetrate the first gate insulating layer 220, the first interlayer insulating layer 120, the separation insulating layer 130 and the second interlayer insulating layer 140 of the pixel area PA.

The first intermediate hole BC1 may be formed in the pixel area PA. The first intermediate hole BC1 may overlap a portion of the light-blocking pattern 410. For example, the first intermediate hole BC1 may penetrate the first gate insulating layer 220, the first interlayer insulating layer 120, the separation insulating layer 130 and the second interlayer insulating layer 140, which are disposed on the light-blocking pattern 410. The first intermediate hole BC1 may be formed at the outside of the capacitor upper electrode 420.

The first bending hole OP1 may be formed on the bending area BA of the device substrate 100. For example, the first bending hole OP1 may penetrate the first gate insulating layer 220, the first interlayer insulating layer 120, the separation insulating layer 130 and the second interlayer insulating layer 140 of the bending area BA. The first bending hole OP1 may partially expose the upper buffer layer 112 of the bending area BA. For example, a vertical depth of the first bending hole OP1 may be greater than the sum of a thickness of the first gate insulating layer 220, a thickness of the first interlayer insulating layer 120, a thickness of the separation insulating layer 130 and a thickness of the second interlayer insulating layer 140 on the bending area BA. For example, an upper portion of the upper buffer layer 112 in the bending area BA may be removed by a process of forming the first bending hole OP1. An upper recess region 112r overlapping with the first bending hole OP1 may be formed at the upper buffer layer 112 of the bending area BA.

The first source contact hole SC1, the first drain contact hole DC1 and the first intermediate hole BC1 may be formed simultaneously with the first bending hole OP1. For example, a vertical depth of the first source contact hole SC1, a vertical depth of the first drain contact hole DC1 and a vertical depth of the first intermediate hole BC1 may each be the same as a vertical depth of the first bending hole OP1. The first source contact hole SC1 and the first drain contact hole DC1 may penetrate the first semiconductor pattern 210. For example, a bottom surface of the first source contact hole SC1 and a bottom surface of the first drain contact hole DC1 may be disposed closer to the device substrate 100 than a lower surface of the first semiconductor pattern 210 (or than an upper surface of the lower buffer layer 111). A bottom surface of the first intermediate hole BC1 may be disposed closer to the device substrate 100 than an upper surface of the upper buffer layer 112 on the light-blocking pattern 410.

The method of forming the display apparatus according to the embodiment of the present disclosure may include a step of forming a second source contact hole SC2, a second drain contact hole DC2, a second intermediate hole BC2 and a second bending hole OP2 on the device substrate 100 in which the first source contact hole SC1, the first drain contact hole DC1, the first intermediate hole BC1 and the first bending hole OP1 are formed, as shown in FIG. 11.

The second source contact hole SC2 and the second drain contact hole DC2 may be formed in the pixel area PA. The second source contact hole SC2 may partially expose the second source region of the second semiconductor pattern 310, and the second drain contact hole DC2 may partially expose the second drain region of the second semiconductor pattern 310. For example, each of the second source contact hole SC2 and the second drain contact hole DC2 may penetrate the second interlayer insulating layer 140 of the pixel area PA.

The second intermediate hole BC2 may be formed in the first intermediate hole BC1. For example, the first intermediate hole BC1 and the second intermediate hole BC2 may constitute an intermediate contact hole BC partially exposing the light-blocking pattern 410. The second intermediate hole BC2 may partially expose a portion of the light-blocking pattern 410 overlapping with the first intermediate hole BC1. For example, the second intermediate hole BC2 may completely penetrate the upper buffer layer 112 and the lower buffer layer 111 in the first intermediate hole BC1. A vertical depth of the second intermediate hole BC2 may be smaller than a vertical depth of the first intermediate hole BC1. The second intermediate hole BC2 may be spaced away from the capacitor upper electrode 420. For example, the intermediate contact hole BC may expose a portion of the light-blocking pattern 410 at the outside of the capacitor upper electrode 420.

The second bending hole OP2 may be formed in the first bending hole OP1. For example, the first bending hole OP1 and the second bending hole OP2 may constitute a bending open hole OP partially exposing the bending area BA of the device substrate 100. The second bending hole OP2 may partially expose a portion of the device substrate 100 overlapping with the first bending hole OP1. The second bending hole OP2 may penetrate the upper buffer layer 112 and the lower buffer layer 111 of the bending area BA. A vertical depth of the second bending hole OP2 may be smaller than a vertical depth of the first bending hole OP1. The vertical depth of the second bending hole OP2 may be greater than a sum of a thickness of the upper buffer layer 112 and a thickness of the lower buffer layer 111 in the first bending hole OP1. For example, the step of the second bending hole OP2 may include a step of forming a groove in a portion of the device substrate 100 overlapping with the second bending hole OP2. A substrate recess region 100r overlapping with the second bending hole OP2 may be formed in the bending area BA of the device substrate 100.

Figures 12, 13:
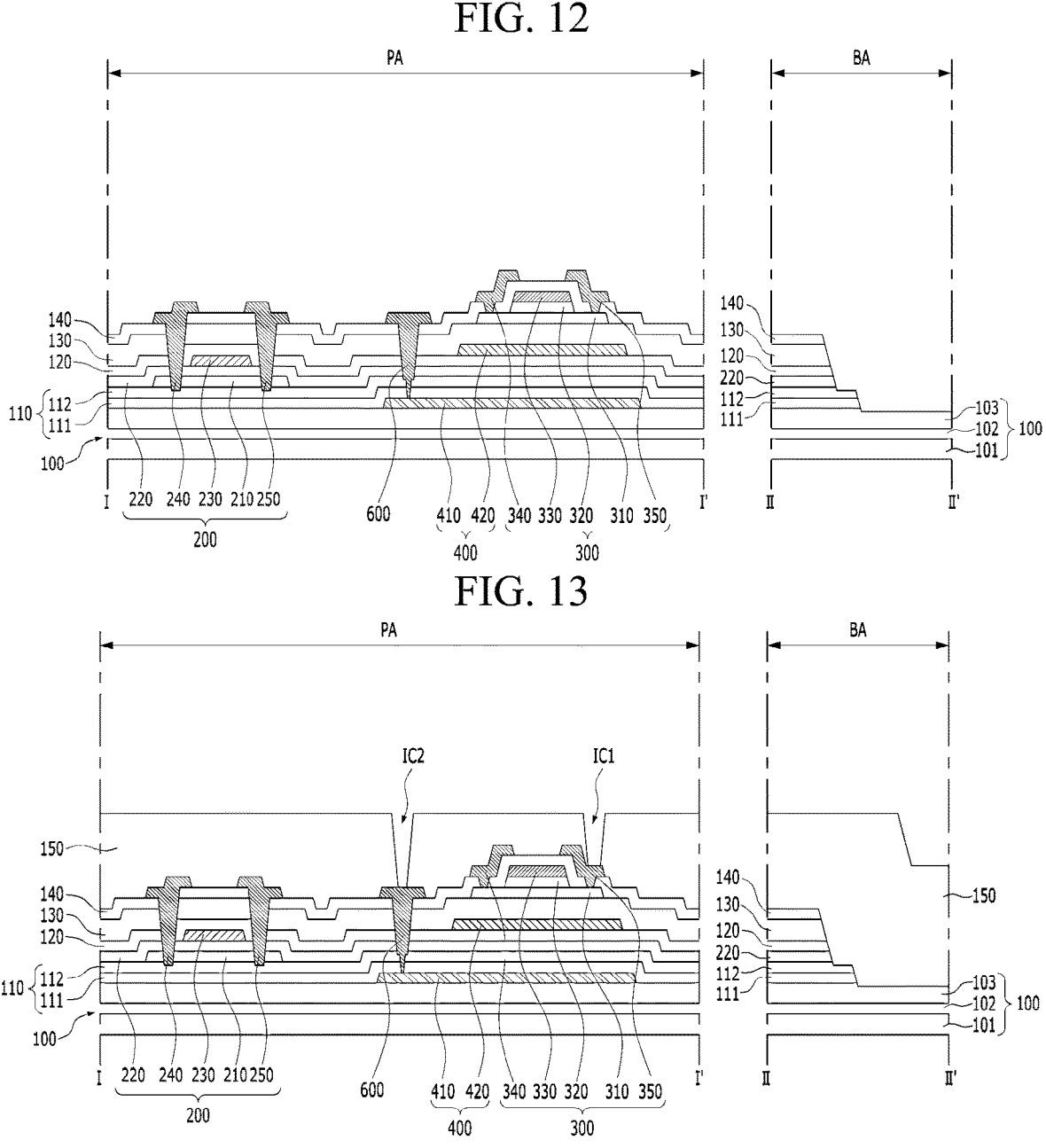

The method of forming the display apparatus according to the embodiment of the present disclosure may include a step of forming a first source electrode 240, a first drain electrode 250, a second source electrode 340, a second drain electrode 350 and an intermediate electrode 600 on the device substrate 100 in which the first source contact hole SC1, the first drain contact hole DC1, the second source contact hole SC2, the second drain contact hole DC2, the intermediate contact hole BC and the bending open hole OP are formed, as shown in FIG. 12.

The first source electrode 240 may be connected to the first source region of the first semiconductor pattern 210 through the first source contact hole SC1, and the first drain electrode 250 may be connected to the first drain region of the first semiconductor pattern 210 through the first drain contact hole DC1. The first semiconductor pattern 210, the first gate insulating layer 220, the first gate electrode 230, the first source electrode 240 and the first drain electrode 250 may constitute a switching thin film transistor 200. The second source electrode 340 may be connected to the second source region of the second semiconductor pattern 310 through the second source contact hole SC2, and the second drain electrode 350 may be connected to the second drain region of the second semiconductor pattern 310 through the second drain contact hole DC2. The second semiconductor pattern 310, the second gate insulating layer 320, the second gate electrode 330, the second source electrode 340 and the second drain electrode 350 may constitute a driving thin film transistor 300. The intermediate electrode 600 may be connected to the light-blocking pattern 410 through the intermediate contact hole BC.

The first source electrode 240, the first drain electrode 250, the second source electrode 340, the second drain electrode 350 and the intermediate electrode 600 may include a conductive material. For example, the first source electrode 240, the first drain electrode 250, the second source electrode 340, the second drain electrode 350 and the intermediate electrode 600 may be formed of a metal, such as aluminum (Al), titanium (Ti), copper (Cu), chrome (Cr), molybdenum (Mo) and tungsten (W). The first source electrode 240, the first drain electrode 250, the second source electrode 340, the second drain electrode 350 and the intermediate electrode 600 may be formed, simultaneously. For example, the step of forming the first source electrode 240, the first drain electrode 250, the second source electrode 340, the second drain electrode 350 and the intermediate electrode 600 may include a step of forming a conductive material layer filling the first source contact hole SC1, the first drain contact hole DC1, the second source contact hole SC2, the second drain contact hole DC2 and the intermediate contact hole BC, and a step of patterning the conductive material layer using a mask. Thus, in the method of forming the display apparatus according to the embodiment of the present disclosure, the intermediate contact hole BC and the intermediate electrode 600 may be formed without using an additional mask. Therefore, the method of forming the display apparatus according to the embodiment of the present disclosure may connect the light-blocking pattern 410 to one of signal wirings, without degrading the process efficiency.

The method of forming the display apparatus according to the embodiment of the present disclosure may include a step of forming a first planarization layer 150 on the device substrate 100 in which the first source electrode 240, the first drain electrode 250, the second source electrode 340, the second drain electrode 350 and the intermediate electrode 600 are formed, and a step of forming a first connection hole IC1 and a second connection hole IC2 in the first planarization layer 150, as shown in FIG. 13.

The first planarization layer 150 may be formed of an insulating material. The first planarization layer 150 may be formed of a material different from the second interlayer insulating layer 140. For example, the first planarization layer 150 may be formed of an organic insulating material. Thus, in the method of forming the display apparatus according to the embodiment of the present disclosure, a thickness difference due to the switching thin film transistor 200, the driving thin film transistor 300, the storage capacitor 400 and the intermediate electrode 600, which are disposed on the pixel area PA of the device substrate 100 may be relieved by the first planarization layer 150. The first planarization layer 150 may be formed on the pixel area PA and the bending area BA of the device substrate 100. For example, the bending open hole OP disposed on the bending area BA of the device substrate 100 may be filled by the first planarization layer 150.

The first connection hole IC1 and the second connection hole IC2 may be formed on the pixel area PA of the device substrate 100. For example, the first connection hole IC1 may partially expose the second drain electrode 350 of the driving thin film transistor 300, and the second connection hole IC2 may expose a portion of the intermediate electrode 600. For example, the first connection hole IC1 and the second connection hole IC2 may completely penetrate the first planarization layer 150. The second connection hole IC2 may be formed simultaneously with the first connection hole IC1.

Figures 14, 15:
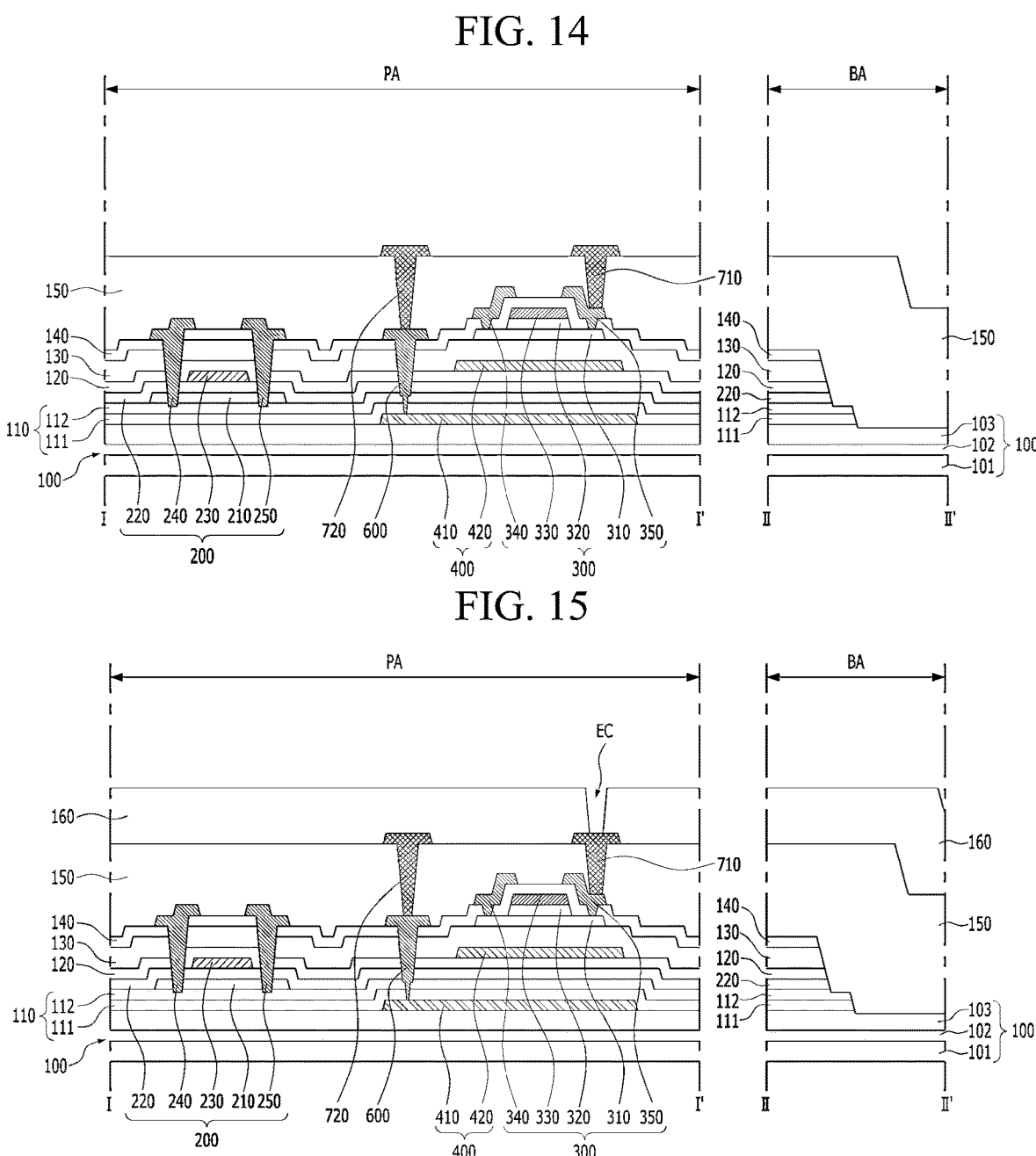

The method of forming the display apparatus according to the embodiment of the present disclosure may include a step of forming a first connection electrode 710 and a second connection electrode 720 on the first planarization layer 150 in which the first connection hole IC1 and the second connection hole IC2 are formed, as shown in FIG. 14.

The first connection electrode 710 may be connected to the second drain electrode 350 of the driving thin film transistor 300 through the first connection hole IC1. The second connection electrode 720 may be connected to the intermediate electrode 600 through the second connection hole IC2. The first connection hole IC1 and the second connection hole IC2 may be formed of a conductive material. For example, the first connection hole IC1 and the second connection hole IC2 may be formed of a metal, such as aluminum (Al), titanium (Ti), copper (Cu), chrome (Cr), molybdenum (Mo) and tungsten (W). The second connection electrode 720 may be formed simultaneously with the first connection electrode 710. For example, the step of forming the first connection electrode 710 and the second connection electrode 720 may include a step of forming a conductive material layer filling the first connection hole IC1 and the second connection hole IC2 on the first planarization layer 150, and a step of patterning the conductive material layer using a mask.

The method of forming the display apparatus according to the embodiment of the present disclosure may include a step of forming a second planarization layer 160 on the device substrate 100 in which the first connection electrode 710 and the second connection electrode 720, and a step of forming an electrode contact hole EC in the second planarization layer 160 of the pixel area PA, as shown in FIG. 15.

The second planarization layer 160 may be formed of an insulating material. For example, the second planarization layer 160 may be formed of an organic insulating material. The second planarization layer 160 may be formed of a material different from a first planarization layer 150. A thickness difference due to the switching thin film transistor 200, the driving thin film transistor 300, the storage capacitor 400, the intermediate electrode 600, the first connection electrode 710 and the second connection electrode 720 on the pixel area PA of the device substrate 100 may be removed by the first planarization layer 150 and the second planarization layer 160. For example, an upper surface of the second planarization layer 160 opposite to the device substrate 100 may be a flat surface in the pixel area PA of the device substrate 100. The second planarization layer 160 may be formed on the pixel area PA and the bending area BA of the device substrate 100. For example, the first planarization layer 150 and the second planarization layer 160 may be sequentially stacked on a portion of the device substrate 100 exposed by the bending open hole OP.

The electrode contact hole EC may partially expose the first connection electrode 710. For example, the electrode contact hole EC may completely penetrate the second planarization layer 160.

Figures 16, 17:
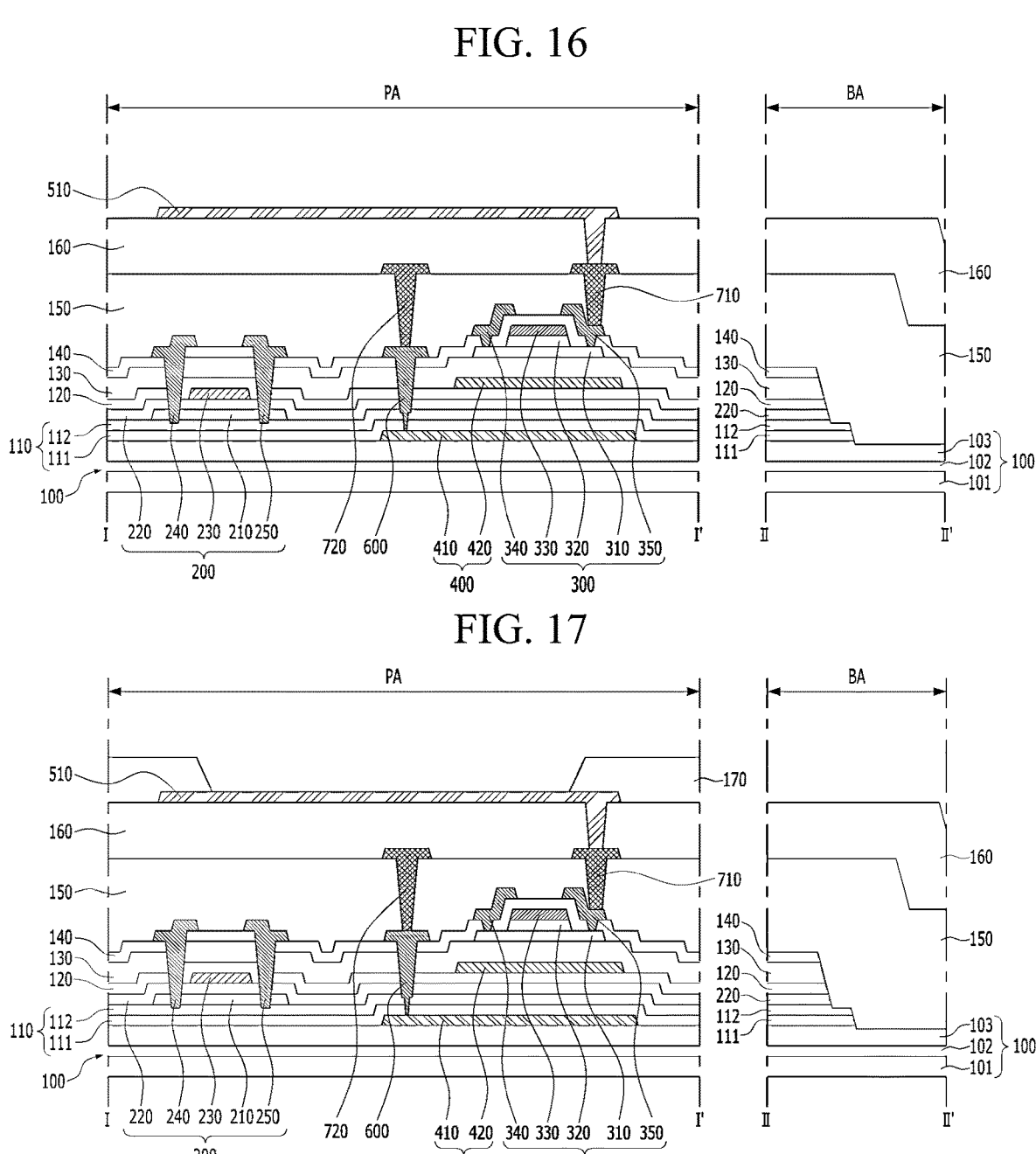

The method of forming the display apparatus according to the embodiment of the present disclosure may include a step of forming a first electrode 510 on the pixel area PA of the device substrate 100 in which the electrode contact hole EC is formed, as shown in FIG. 16.

The first electrode 510 may include a conductive material. The first electrode 510 may be formed of a material having a high reflectance. The first electrode 510 may have a multi-layer structure. For example, the step of forming the first electrode 510 may include a step of forming a first transparent electrode layer on the device substrate 100 using a transparent conductive material, such as ITO and IZO, a step of forming a reflective electrode layer on the first transparent electrode layer using a metal, a step of forming a second transparent electrode layer on the reflective electrode layer using a transparent conductive material, such as ITO and IZO, and a step of sequentially patterning the second transparent electrode layer, the reflective electrode layer and the first transparent electrode layer using a mask.

The method of forming the display apparatus according to the embodiment of the present disclosure may include a step of forming a bank insulating layer 170 on the pixel area PA of the device substrate 100, as shown in FIG. 17.

The bank insulating layer 170 may be formed of an insulating material. For example, the bank insulating layer 170 may be formed of an organic insulating material. The bank insulating layer 170 may expose a portion of the first electrode 510. For example, the bank insulating layer 170 may cover an edge of the first electrode 510. The bank insulating layer 170 may be in direct contact with the second planarization layer 160 at the outside of the first electrode 510. For example, the step of forming the bank insulating layer 170 may include a step of forming an insulating material layer on the device substrate 100 in which the first electrode 510 is formed, and a step of removing a portion of the insulating material layer overlapping with the portion of the first electrode 510 using a mask. The bank insulating layer 170 may be formed of a material different from the second planarization layer 160.

Figures 18, 19:
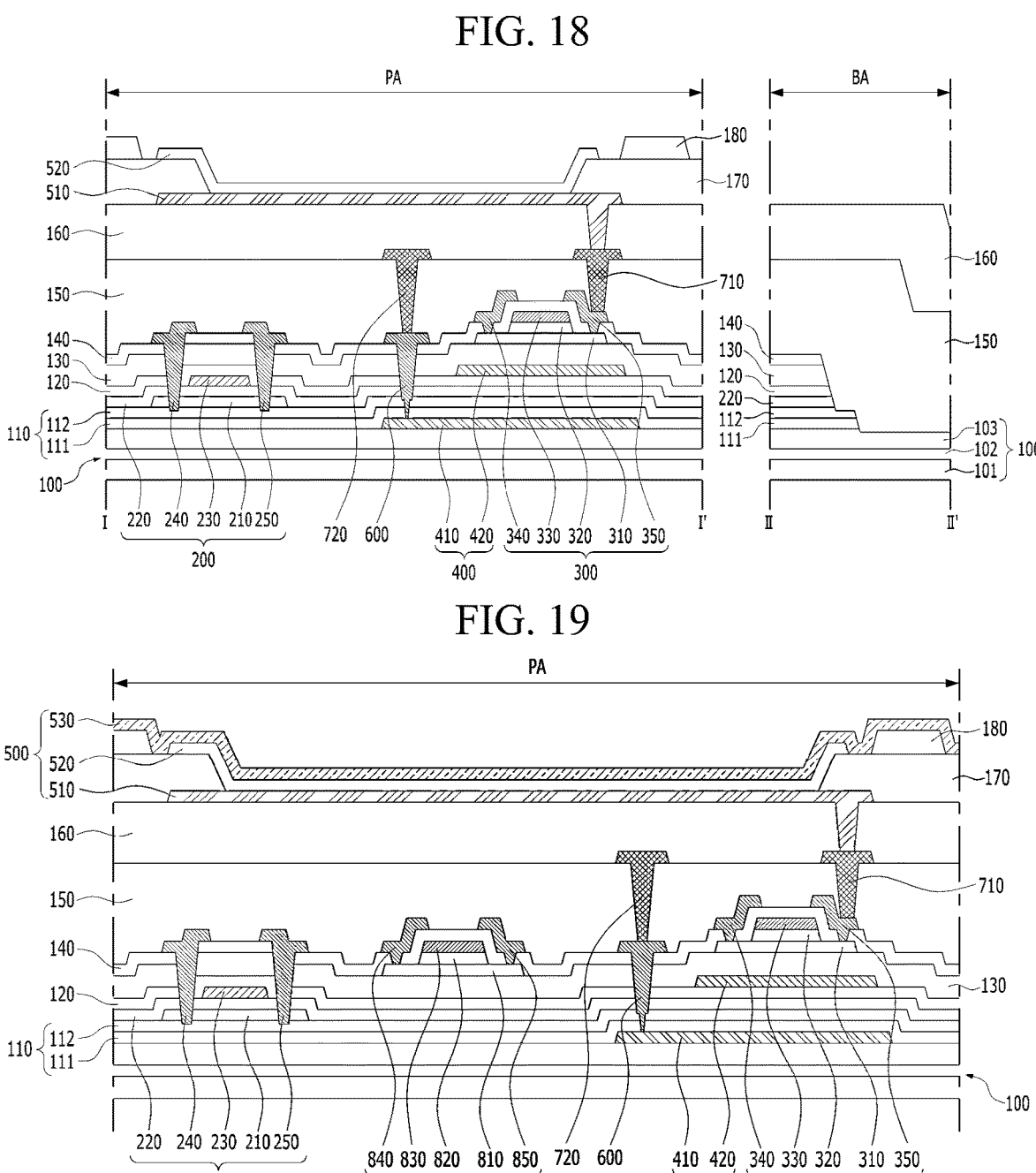

The method of forming the display apparatus according to the embodiment of the present disclosure may include a step of forming a light-emitting layer 520 on the portion of the first electrode 510 exposed by the bank insulating layer 170, as shown in FIG. 18.

The light-emitting layer 520 may be formed using a fine metal mask (FMM). For example, the step of forming the light-emitting layer 520 may include a step of forming a spacer 180 on the bank insulating layer 170, a step of locating the fine metal mask (FMM) having an opening overlapping with the portion of the first electrode 510 exposed by the bank insulating layer 170 on the spacer 180, and a step of depositing an emission material through the opening of the fine metal mask (FMM).

The method of forming the display apparatus according to the embodiment of the present disclosure may include a step of forming a second electrode 530 on the pixel area PA of the device substrate 100 in which the light-emitting layer 520 is formed, as shown in FIGS. 2 and 3A to 3C.

The second electrode 530 may be formed of a conductive material. The second electrode 530 may be formed as a transparent electrode having a higher transmittance than the first electrode 510. For example, the second electrode 530 may be formed of a transparent conductive material, such as ITO and IZO. The first electrode 510, the light-emitting layer 520 and the second electrode 530 may constitute a light-emitting device 500.

Accordingly, the display apparatus according to the embodiment of the present disclosure may include the light-blocking pattern 410 in each pixel area PA of the device substrate 100 to block the light travelling in a direction toward the second semiconductor pattern 310 of the driving thin film transistor 300 in the corresponding pixel area PA, wherein the intermediate contact hole BC exposing a portion of the light-blocking pattern 410 may be formed using a process of forming the bending open hole OP in the bending area BA of the device substrate 100, wherein the intermediate electrode 600 connected to the light-blocking pattern 410 through the intermediate contact hole BC may be formed using a process of forming the second source electrode 340 and the second drain electrode 350 of the driving thin film transistor 300. Thus, in the display apparatus according to the embodiment of the present disclosure, the light-blocking pattern 410 may be connected to one of the signal wirings, without an additional process using a mask. Therefore, in the display apparatus according to the embodiment of the present disclosure, a change in the characteristics of the driving thin film transistor 300 due to the external light may be effectively prevented without degrading the process efficiency.

The display apparatus according to the embodiment of the present disclosure is described that the light-blocking pattern 410 in each pixel area PA is a shape of island. However, in the display apparatus according to another embodiment of the present disclosure, the light-blocking pattern 410 may have a mesh shape extending a first direction and a second direction perpendicular to the first direction. For example, in the display apparatus according to another embodiment of the present disclosure, the light-blocking pattern 410 in each pixel area PA may be connected to the light-blocking pattern 410 of the pixel area PA adjacent in the first direction and the light-blocking pattern 410 of the pixel area PA adjacent in the second direction. Thus, in the display apparatus according to another embodiment of the present disclosure, a voltage may be stably applied to the light-blocking pattern of each pixel area PA. And, in the display apparatus according to another embodiment of the present disclosure, a resistance of the signal wiring electrically connected to the light-blocking pattern 410 may be reduced by the light-blocking pattern 410. For example, the display apparatus according to another embodiment of the present disclosure may prevent a voltage drop due to the resistance of the power supply voltage supply line by using the light-blocking pattern 410. Therefore, in the display apparatus according to another embodiment of the present disclosure, the luminance deviation of the light-emitting device 500 in each pixel area PA may be prevented.

The display apparatus according to the embodiment of the present disclosure is described that the driving circuit of each pixel area PA may include a single switching thin film transistor 200. However, in the display apparatus according to another embodiment of the present disclosure, a plurality of the switching thin film transistor 200 may be disposed in each pixel area PA.

For example, in the display apparatus according to another embodiment of the present disclosure, the driving circuit of each pixel area PA may include the first switching thin film transistor 200, the driving thin film transistor 300 and a second switching thin film transistor 800, as shown in FIG. 19. The second switching thin film transistor 800 may have the same structure as the first switching thin film transistor 200. For example, the second switching thin film transistor 800 may include a third semiconductor pattern 810, a third gate insulating layer 820, a third gate electrode 830, a third source electrode 840 and a third drain electrode 850.

The third semiconductor pattern 810 may include a semiconductor material. The third semiconductor pattern 810 may include a material different from the first semiconductor pattern 210 of the first switching thin film transistor 200. For example, the third semiconductor pattern 810 may include an oxide semiconductor, such as IGZO. The third semiconductor pattern 810 may be disposed on a layer different from the first semiconductor pattern 210. For example, the third semiconductor pattern 810 may be disposed on the same layer as the second semiconductor pattern 310 of the driving thin film transistor 300. The third semiconductor pattern 810 may include the same material as the second semiconductor pattern 310.

The third semiconductor pattern 810 may include a third source region, a third channel region and a third drain region. The third channel region may be disposed between the third source region and the third drain region. The third source region and the third drain region may have a resistance lower than the third channel region. For example, the third source region and the third drain region may include a conductorized region of an oxide semiconductor. The third channel region may be a region of an oxide semiconductor which is not conductorized.

The third gate insulating layer 820 may be disposed on the third channel region of the third semiconductor pattern 810. The third source region and the third drain region of the third semiconductor pattern 810 may be disposed outside the third gate insulating layer 820. The third gate electrode 830 may be disposed on the third gate insulating layer 820. For example, the third gate electrode 830 may overlap the third channel region of the third semiconductor pattern 810.

The third gate insulating layer 820 may include an insulating material. For example, the third gate insulating layer 820 may include an inorganic insulating material, such as silicon oxide (SiO). The third gate insulating layer 820 may include the same material as the second gate insulating layer

320 of the driving thin film transistor 300. The third gate electrode 830 may include a conductive material. For example, the third gate electrode 830 may include a metal, such as aluminum (Al), titanium (Ti), copper (Cu), chrome (Cr), molybdenum (Mo) and tungsten (W). The third gate electrode 830 may include the same material as the second gate electrode 330 of the driving thin film transistor 300. The third gate electrode 830 may be insulated from the third semiconductor pattern 810 by the third gate insulating layer 820. For example, the third channel region of the third semiconductor pattern 810 may have an electrical conductivity corresponding to a voltage applied to the third gate electrode 830.

The third source electrode 840 and the third drain electrode 850 may include a conductive material. For example, the third source electrode 840 and the third drain electrode 850 may include a metal, such as aluminum (Al), titanium (Ti), copper (Cu), chrome (Cr), molybdenum (Mo) and tungsten (W). The third source electrode 840 and the third drain electrode 850 may include a material different from the third gate electrode 830. The third source electrode 840 and the third drain electrode 850 may be insulated from the third gate electrode 830. The third source electrode 840 and the third drain electrode 850 may be disposed on a layer different from the third gate electrode 830. For example, the second interlayer insulating layer 140 may extend between the third gate electrode 830 and the third source electrode 840 and between the third gate electrode 830 and the third drain electrode 850. The third source electrode 840 and the third drain electrode 850 may include the same material as the second source electrode 340 and the second drain electrode 350 of the driving thin film transistor 300.

The second switching thin film transistor 800 may be spaced away from the first switching thin film transistor 200 and the driving thin film transistor 300. For example, in the display apparatus according to another embodiment of the present disclosure, an internal compensation circuit including the second switching thin film transistor 800 may be disposed in each pixel area PA. Thus, in the display apparatus according to another embodiment of the present disclosure, the degree of freedom in the configuration of each pixel area PA may be improved.

The display apparatus according to the embodiment of the present disclosure is described that the capacitor upper electrode 420 includes a material different from the first gate electrode 230. However, in the display apparatus according to another embodiment of the present disclosure, the capacitor upper electrode 420 may be formed of the same material as the first gate electrode 230. For example, the capacitor upper electrode 420 may be formed simultaneously with the first gate electrode 230. The capacitor upper electrode 420 may be disposed on the same layer as the first gate electrode 230. For example, the capacitor upper electrode 420 may be disposed between the first gate insulating layer 220 and the first interlayer insulating layer 120. Thus, in the display apparatus according to another embodiment of the present disclosure, a process of forming the storage capacitor 400 may be simplified. Therefore, in the display apparatus according to another embodiment of the present disclosure, the process efficiency may be improved.

The display apparatus according to the embodiment of the present disclosure is described that the light-blocking pattern 410 of each pixel area PA is an electrode of the storage capacitor 400 in the corresponding pixel area PA. However, in the display apparatus according to another embodiment of the present disclosure, the storage capacitor 400 of each pixel area PA may not include the light-blocking pattern 410 of the corresponding pixel area PA.

Figures 20, 21:
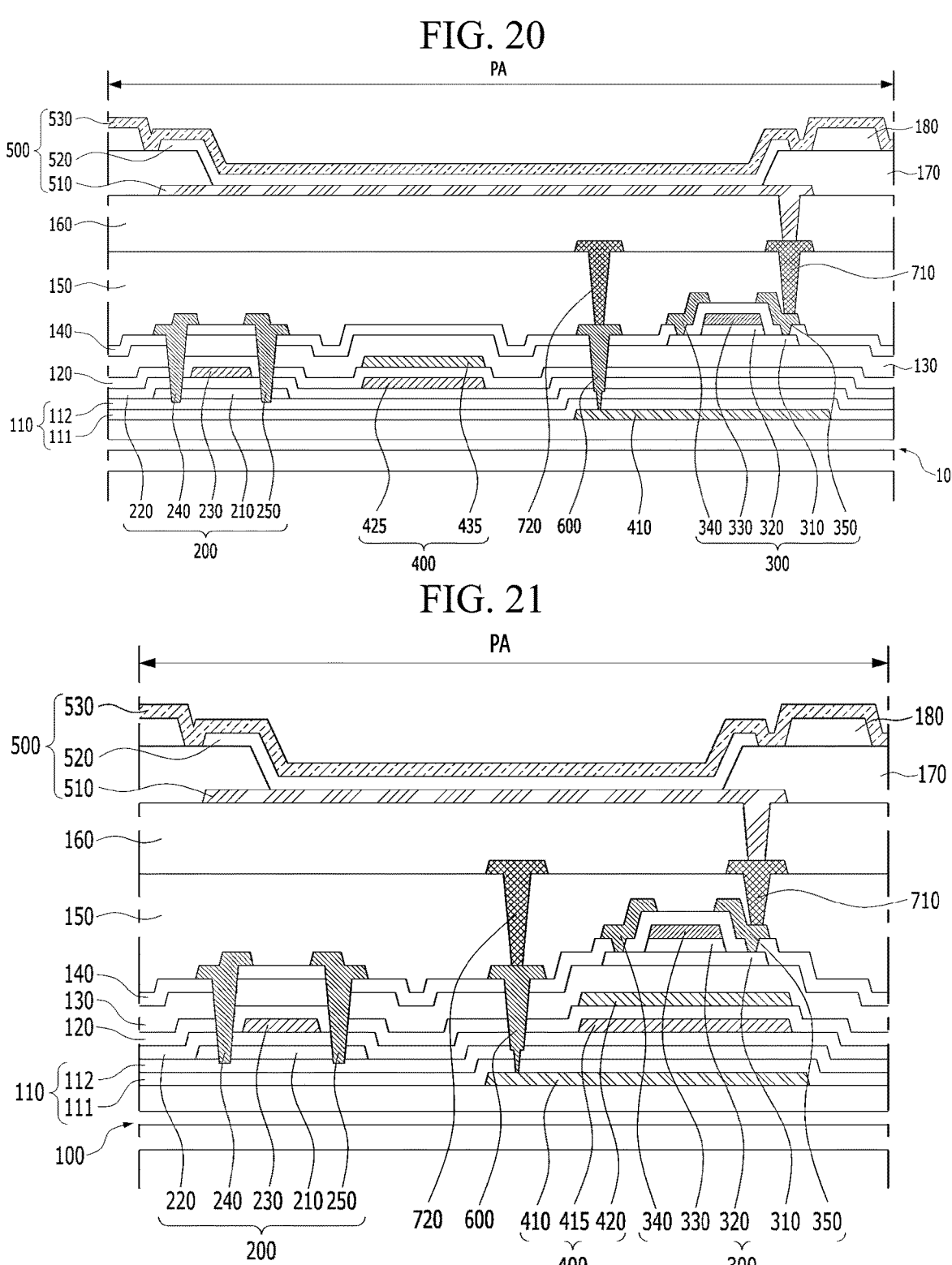

For example, in the display apparatus according to another embodiment of the present disclosure, the storage capacitor 400 in each pixel area PA may have a stacked structure of a capacitor lower electrode 425 being spaced away from the light-blocking pattern 410 of the corresponding pixel area PA and a capacitor upper electrode 435, as shown in FIG. 20. The capacitor lower electrode 425 and the capacitor upper electrode 435 may be disposed on a layer different from the light-blocking pattern 410. For example, the capacitor lower electrode 425 may be disposed between the first gate insulating layer 220 and the first interlayer insulating layer 120, and the capacitor upper electrode 435 may be disposed between the first interlayer insulating layer 120 and the separation insulating layer 130. The capacitor lower electrode 425 may include the same material as the first gate electrode 230. The capacitor upper electrode 435 may include a material different from the capacitor lower electrode 425. Thus, in the display apparatus according to another embodiment of the present disclosure, blocking the external light by the light-blocking pattern 410 may be effectively performed.

The display apparatus according to the embodiment of the present disclosure is described that the storage capacitor 400 of each pixel area PA has a stacked structure of the light-blocking pattern 410 and the capacitor upper electrode 420. However, in the display apparatus according to another embodiment of the present disclosure, the storage capacitor of each pixel area PA may have a stacked structure of three or more capacitor electrodes.

For example, in the display apparatus according to another embodiment of the present disclosure, the storage capacitor 400 of each pixel area PA may further include a capacitor intermediate electrode 415 between the light-blocking pattern 410 and the capacitor upper electrode 420, as shown in FIG. 21. The capacitor intermediate electrode 415 may be formed using a process of forming the switching thin film transistor 200. For example, the capacitor intermediate electrode 415 may be disposed on the same layer as the first gate electrode 230 of the switching thin film transistor 200. The capacitor intermediate electrode 415 may include the same material as the first gate electrode 230. Thus, in the display apparatus according to another embodiment of the present disclosure, an area occupied by the storage capacitor 400 of each pixel area PA may be reduced, without the degradation of process efficiency. Therefore, in the display apparatus according to another embodiment of the present disclosure, the resolution may be improved.

Figure 22:
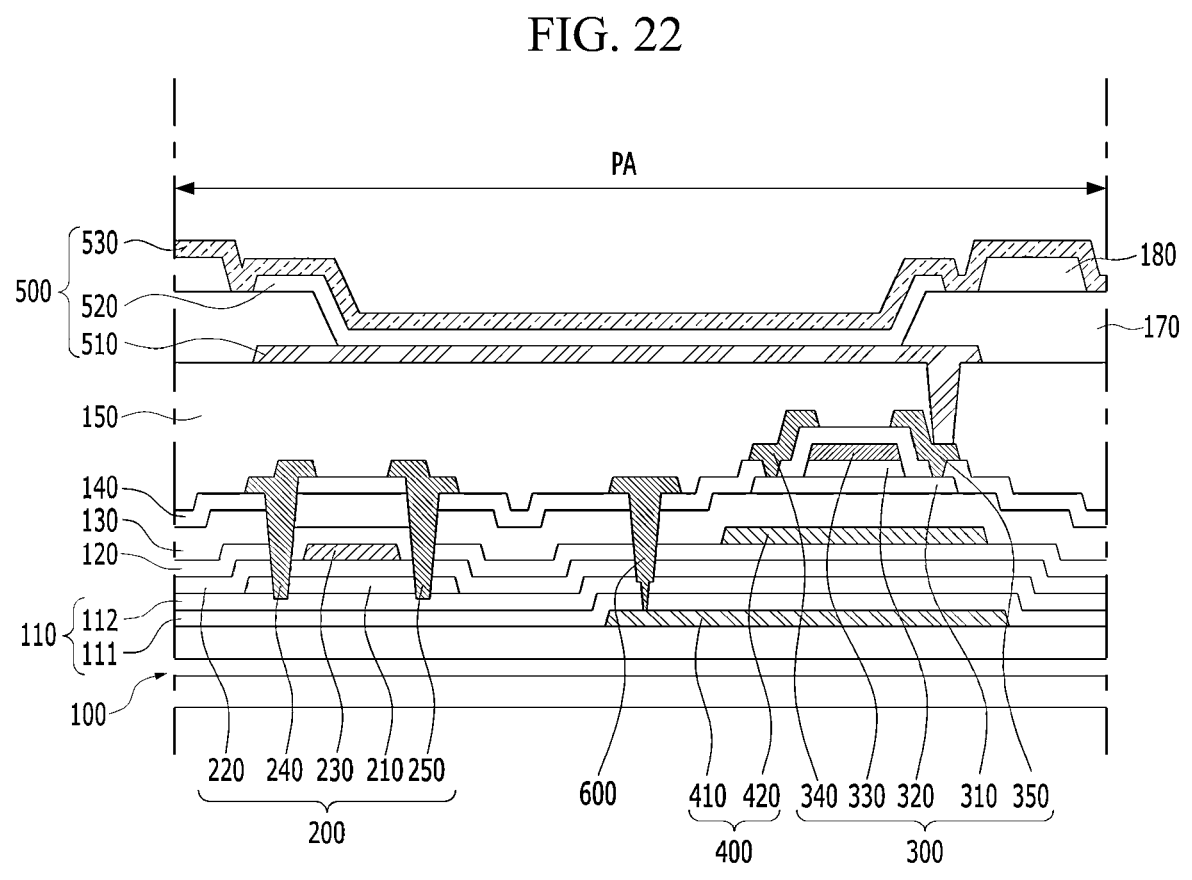

The display apparatus according to the embodiment of the present disclosure is described that the first planarization layer 150 and the second planarization layer 160 are stacked between the driving circuit and the light-emitting device 500 of each pixel area PA. However, in the display apparatus according to another embodiment of the present disclosure, the second planarization layer 160 may be omitted, as shown in FIG. 22. Thus, in the display apparatus according to another embodiment of the present disclosure, the light-emitting device 500 of each pixel area PA may be disposed on the first planarization layer 150. The first electrode 510 in each pixel area PA may be in direct contact with the second drain electrode 350 of the driving thin film transistor 300 by penetrating the first planarization layer 150. Therefore, in the display apparatus according to another embodiment of the present disclosure, the degree of freedom in the configuration of each pixel area PA may be improved.

Figures 23, 24:
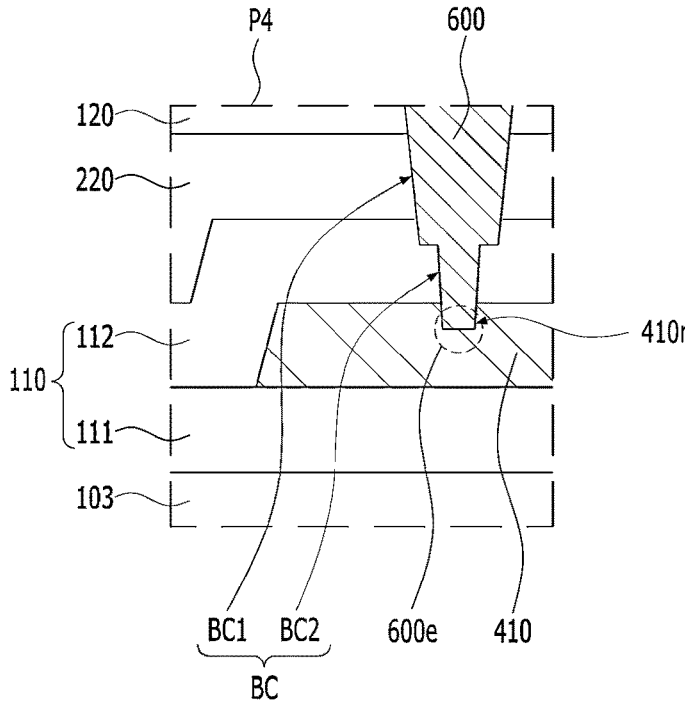
Figure 27:
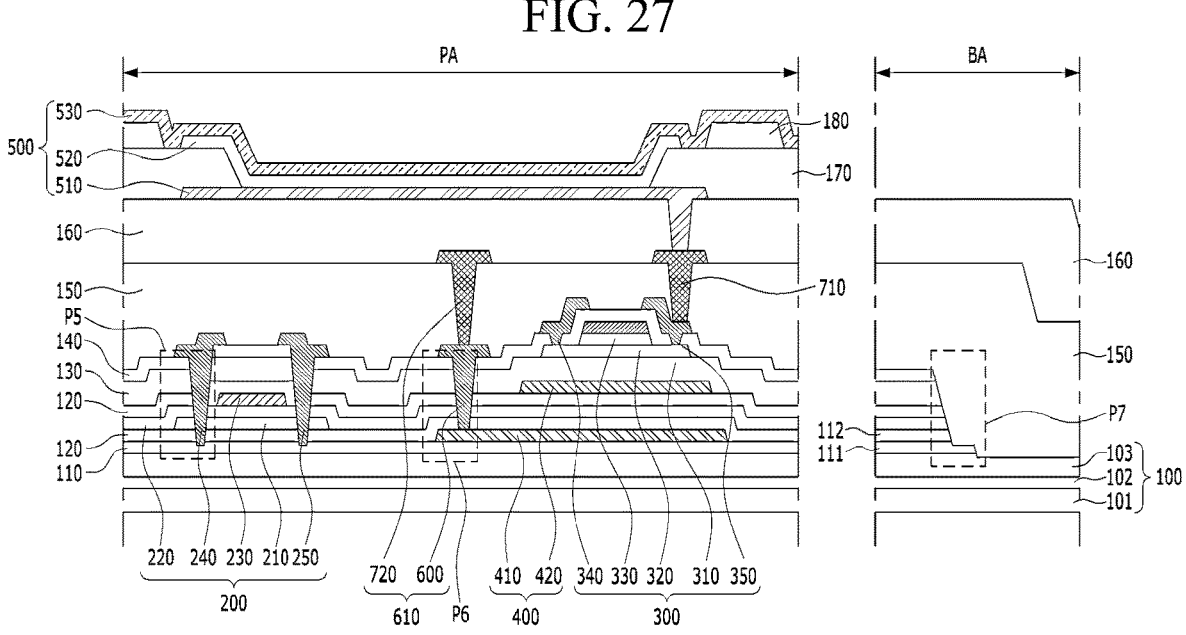
Figure 28C:
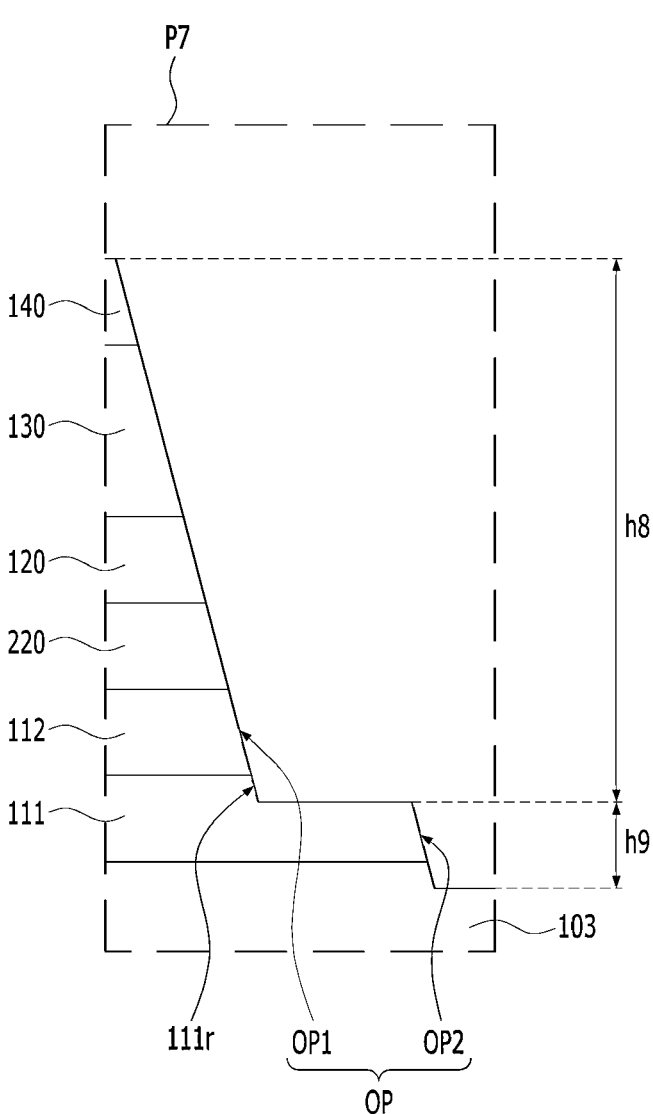
FIG. 28C is an enlarged view of P7 region in FIG. 27.

The display apparatus according to the embodiment of the present disclosure is described that the light-blocking pattern 410 of each pixel area PA is disposed between the device substrate 100 and the buffer insulating layer 110. However, in the display apparatus according to another embodiment of the present disclosure, a lower surface of the light-blocking pattern 410 in each pixel area PA may be spaced away from the device substrate 100. For example, in the display apparatus according to another embodiment of the present disclosure, the light-blocking pattern 410 of each pixel area PA may be disposed between the lower buffer layer 111 and the upper buffer layer 112, as shown in FIGS. 23 and 24. That is, the lower buffer layer 111 may extend between the device substrate 100 and the light-blocking pattern 410. A lower end 600e of the intermediate electrode 600 may be disposed closer to the device substrate 100 than an upper surface of the light-blocking pattern 410. For example, the light-blocking pattern 410 may include a blocking recess region 410r overlapping with the second intermediate hole BC2.

Figures 25, 26:
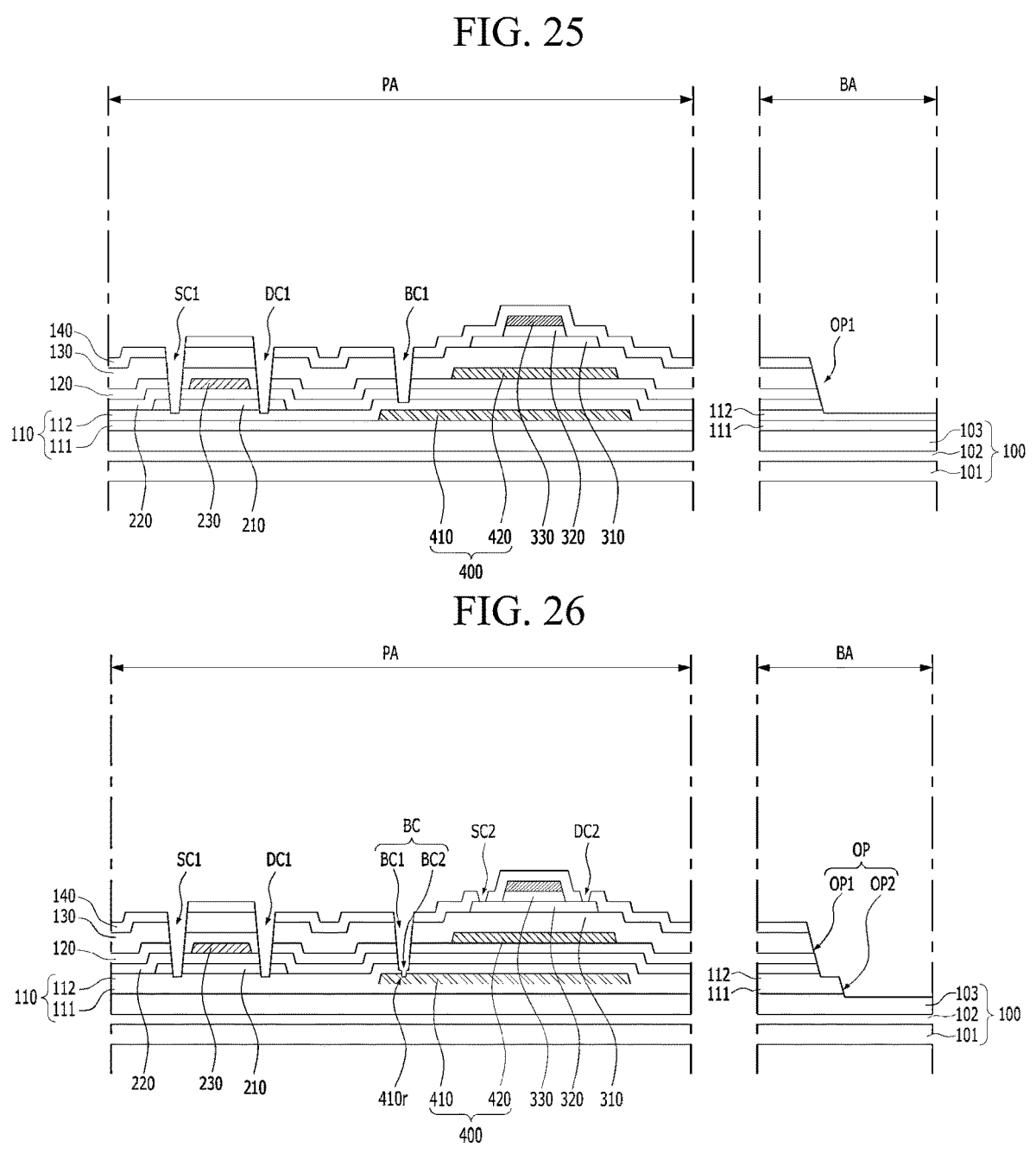

FIGS. 25 and 26 are views sequentially showing a method of forming the display apparatus according to another embodiment of the present disclosure. A method of forming the display apparatus according to another embodiment of the present disclosure will be described with reference to FIGS. 23 to 26. First, the method of forming the display apparatus according to another embodiment of the present disclosure may include a step of forming a lower buffer layer 111 on a pixel area PA and a bending area BA of a device substrate 100, a step of forming a light-blocking pattern 410 on the lower buffer layer 111 of the pixel area PA, a step of forming an upper buffer layer 112 on the pixel area PA and the bending area BA of the device substrate 100 in which the light-blocking pattern 410 is formed, and a step of forming a first semiconductor pattern 210, a first gate insulating layer 220, a first gate electrode 230, a first interlayer insulating layer 120, a capacitor upper electrode 420, a separation insulating layer 130, a second semiconductor pattern 310, a second gate insulating layer 320, a second gate electrode 330, a first source contact hole SC1, a first drain contact hole DC1, a first intermediate hole BC1 and a first bending hole OP1 on the upper buffer layer 112, as shown in FIG. 25.

The method of forming the display apparatus according to another embodiment of the present disclosure may include a step of forming a second source contact hole SC2, a second drain contact hole DC2, a second intermediate hole BC2 and a second bending hole OP2 on the device substrate 100 in which the first source contact hole SC1, the first drain contact hole DC1, the first intermediate hole BC1 and the first bending hole OP1 are formed, as shown in FIG. 26.

The second intermediate hole BC2 may be formed simultaneously with the second bending hole OP2. A bottom surface of the second intermediate hole BC2 may be disposed closer to the device substrate 100 than an upper surface of the light-blocking pattern 410. For example, a step of forming the second intermediate hole BC2 may include a step of forming a groove in a portion of the light-blocking pattern 410 overlapping with the second intermediate hole BC2. A blocking recess region 410r may be formed in the portion of the light-blocking pattern 410 overlapping with the second intermediate hole BC2.

The method of forming the display apparatus according to another embodiment of the present disclosure may include a step of forming a first source electrode 240, a first drain electrode 250, a second source electrode 340, a second drain electrode 350, an intermediate electrode 600, a first planarization layer 150, a first connection electrode 710, a second connection electrode 720, a second planarization layer 160, a light-emitting device 500, a bank insulating layer 170 and a spacer 180 on the device substrate 100 in which the blocking recess region 410r is formed, as shown in FIGS. 23 and 24.

Accordingly, in the display apparatus according to another embodiment of the present disclosure, the light-blocking pattern 410 of each pixel area PA may be formed in the buffer insulating layer 110. Thus, in the display apparatus according to another embodiment of the present disclosure, the damage of the device substrate 100 due to a process of forming the light-blocking pattern 410 may be prevented. Therefore, in the display apparatus according to another embodiment of the present disclosure, the degree of freedom in the location of the light-blocking pattern 410 may be improved.

The display apparatus according to the embodiment of the present disclosure is described that the intermediate contact hole BC includes the first intermediate hole BC1 and the second intermediate hole BC2. However, in the display apparatus according to another embodiment of the present disclosure, the intermediate contact hole BC may be formed by a single process. For example, in the display apparatus according to another embodiment of the present disclosure, each of the first source contact hole SC1, the first drain contact hole and the first bending hole OP1 may expose a portion of the lower buffer layer 111, as shown in FIGS. 27 and 28A to 28C. The first source contact hole SC1, the first drain contact hole, the intermediate contact hole BC and the first bending hole OP1 may penetrate the upper buffer layer 112, the first gate insulating layer 220, the first interlayer insulating layer 120, the separation insulating layer 130 and the second interlayer insulating layer 140. A bottom surface Sb of the first source contact hole SC1 may be disposed closer to the device substrate 100 than an upper surface of the lower buffer layer 111. For example, a vertical depth h6 of the first source contact hole SC1 may be greater than a vertical depth h7 of the intermediate contact hole BC.

A vertical depth h8 of the first bending hole OP1 may be the same as the vertical depth h6 of the first source contact hole SC1. For example, the first source contact hole SC1, the first drain contact hole, the intermediate contact hole BC and the first bending hole OP1 may be formed, simultaneously. The lower buffer layer 111 of the bending area BA may include a lower recess region 111r overlapping with the first bending hole OP1. The second bending hole OP2 formed in the first bending hole OP1 may penetrate the lower buffer layer 111. For example, a vertical depth h9 of the second bending hole OP2 may be smaller than a thickness of the buffer insulating layer 110. A groove may be formed in a portion of the device substrate 100 overlapping with the second bending hole OP2.

In the display apparatus according to another embodiment of the present disclosure, the intermediate contact hole BC exposing a portion of the light-blocking pattern 410 may be formed simultaneously with the first source contact hole SC1, the first drain contact hole and the first bending hole OP1. Thus, in the display apparatus according to another embodiment of the present disclosure, the degree of freedom for the location of the light-blocking pattern 410 may be improved, without over-etching the light-blocking pattern 410 by a process of forming the intermediate contact hole BC. Therefore, in the display apparatus according to another embodiment of the present disclosure, a change in the characteristics of the driving thin film transistor 300 due to the external light may be effectively prevented, without degrading the process efficiency.

Figure 29:
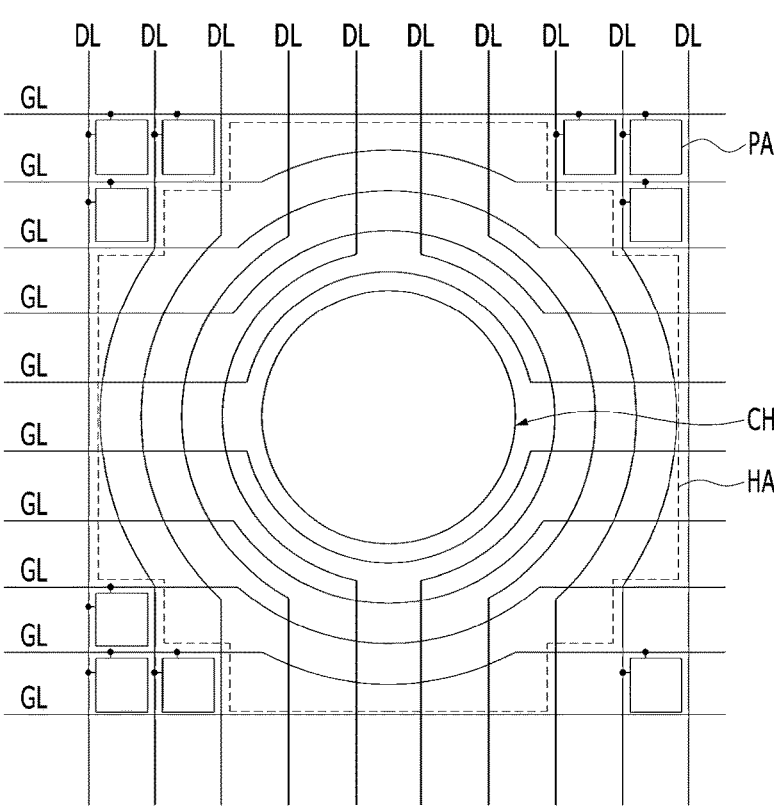
Figure 30:
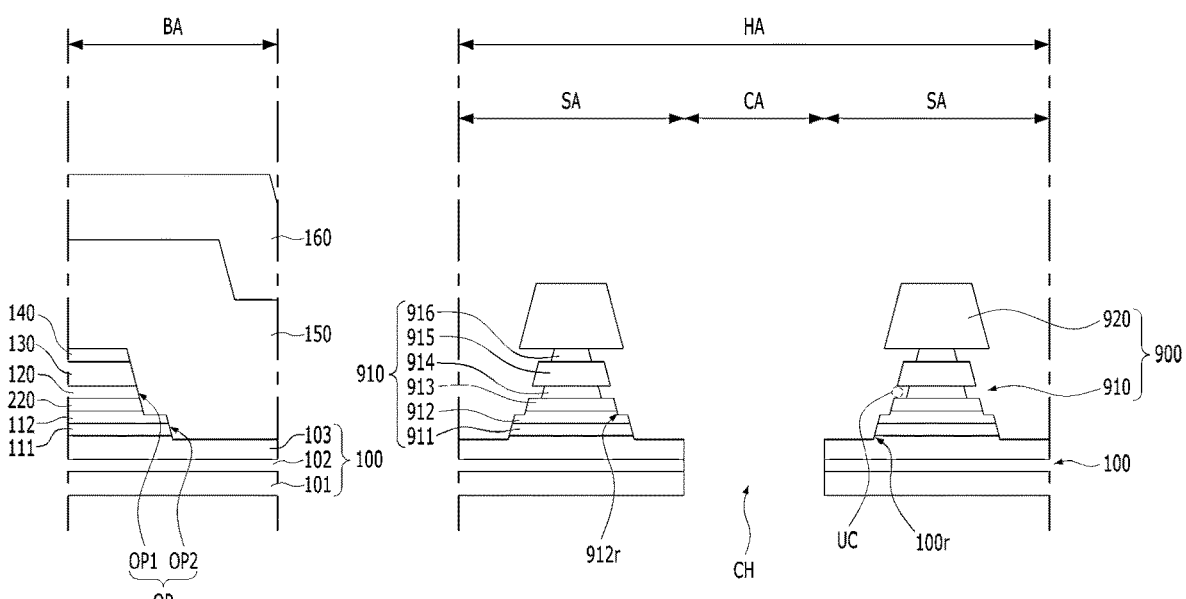

The display apparatus according to another embodiment of the present disclosure may include a substrate hole CH disposed between the pixel areas PA of the display area AA, as shown in FIGS. 29 and 30. The substrate hole CH may penetrate a portion of the device substrate 100. At least one separating partition 900 may be disposed around the substrate hole CH. For example, the device substrate 100 may include a hole peripheral area HA made of a hole area CA in which the substrate hole CH is disposed, and a separation area SA in which the separating partition 900 is disposed. The separation area SA may be disposed between the pixel areas PA and the hole area CA. For example, the hole area CA may be surrounded by the separation area SA.

The separating partition 900 may include at least one under-cut UC. An organic layer formed by the subsequent process may be partially broken by the under-cut UC of the separating partition 900. A vertical distance of the separating partition 900 may be greater than a vertical depth of the bending open hole OP. Thus, the display apparatus according to another embodiment of the present disclosure may prevent the external moisture introduced through the substrate hole CH from penetrating the pixel areas PA through the organic layer.

The separating partition 900 may have a stacked structure of a body part 910 and a cap part 920. The body part 910 of the separating partition 900 may be formed using a process of forming the driving circuit in each pixel area PA. For example, the body part 910 of the separating partition 900 may include a first insulating pattern 911, a second insulating pattern 912, a third insulating pattern 913, a fourth insulating pattern 914, a fifth insulating pattern 915 and a sixth insulating pattern 916, which are sequentially stacked on the device substrate 100. The first insulating pattern 911 may include the same material as the lower buffer layer 111. The second insulating pattern 912 may include the same material as the upper buffer layer 112. The third insulating pattern 913 may include the same material as the first gate insulating layer 220. The fourth insulating pattern 914 may include the same material as the first interlayer insulating layer 120. The fifth insulating pattern 915 may include the same material as the separation insulating layer 130. The sixth insulating pattern 916 may include the same material as the second interlayer insulating layer 140. A patterning process of the first insulating pattern 911, the second insulating pattern 912, the third insulating pattern 913, the fourth insulating pattern 914, the fifth insulating pattern 915 and the sixth insulating pattern 916 may be performed simultaneously with the forming process of the bending open hole OP. For example, a substrate recess region 100r may be formed in a portion of the device substrate 100 around the separating partition 900. A partition recess region 912r may be formed in both end of the second insulating pattern 912. The cap part 920 may be formed using at least one of layers formed on the second interlayer insulating layer 140. For example, the cap part 920 may include the same material as the second planarization layer 160.

The under-cut UC may be formed using an etch-selectivity of the insulating patterns 911, 912, 913, 914, 915 and 916. For example, in the display apparatus according to another embodiment of the present disclosure, the lower buffer layer 111, the first insulating pattern 911, the upper buffer layer 112, the second insulating pattern 912, the first gate insulating layer 220, the third insulating pattern 913, the separation insulating layer 130 and the fifth insulating pattern 915 may be formed of silicon oxide (SiC), the first interlayer insulating layer 120, the fourth insulating pattern 914, the second interlayer insulating layer 140 and the sixth insulating pattern 916 may be formed of silicon nitride (SiN), and the under-cut UC of the separating partition 900 may be formed by an over-etching of the fourth insulating pattern 914 and the sixth insulating pattern 916, which are formed of silicon nitride (SiN). Thus, in the display apparatus according to another embodiment of the present disclosure, the separating partition 900 and the intermediate contact hole may be formed using a forming process of the bending open hole OP. Therefore, in the display apparatus according to another embodiment of the present disclosure, a change in the characteristics of the driving thin film transistor in each pixel area PA due to the external light and the deterioration of the light-emitting layer in each pixel area PA due to the external moisture introduced through the substrate hole CH may be prevented, without degrading the process efficiency.

In the result, the display apparatus according to the embodiments of the present disclosure may include the intermediate contact hole on the pixel area of the device substrate and the bending open hole on the bending area of the device substrate, wherein the intermediate electrode may be connected to the light-blocking pattern through the intermediate contact hole, wherein the bending open hole may partially expose the bending area of the device substrate, and wherein the intermediate contact hole may be formed using a process of forming the bending open hole. Thus, in the display apparatus according to the embodiments of the present disclosure, an additional mask for forming the intermediate contact hole may be not used. Thereby, in the display apparatus according to the embodiments of the present disclosure, a change in the characteristics of the driving thin film transistor may be effectively prevented, without degrading the process efficiency.

It will be apparent to those skilled in the art that various modifications and variations can be made in the display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display apparatus comprising:

a light-blocking pattern on a pixel area of a device substrate;

an upper buffer layer on the light-blocking pattern, the upper buffer layer extending on a bending area of the device substrate;

a switching thin film transistor on the upper buffer layer of the pixel area, the switching thin film transistor including a first semiconductor pattern spaced away from the light-blocking pattern;

a separation insulating layer on the first semiconductor pattern, the separation insulating layer extending on the upper buffer layer of the bending area;

a driving thin film transistor on the separation insulating layer of the pixel area, the driving thin film transistor including a second semiconductor pattern overlapping with a portion of the light-blocking pattern;

a bending open hole on the bending area of the device substrate, the bending open hole including a first bending hole exposing a portion of the upper buffer layer and a second bending hole exposing a portion of the device substrate in the first bending hole; and an intermediate electrode on the separation insulating layer of the pixel area, the intermediate electrode connected to the light-blocking pattern through an intermediate contact hole, wherein the intermediate contact hole includes a first intermediate hole partially exposing the upper buffer layer of pixel area and a second intermediate hole partially exposing a portion of the light-blocking pattern which overlaps the first intermediate hole, and wherein a vertical depth of the first intermediate hole is the same as a vertical depth of the first bending hole.

2. The display apparatus according to claim 1, wherein the first semiconductor pattern includes silicon, and the second semiconductor pattern includes an oxide semiconductor.

3. The display apparatus according to claim 1, wherein a vertical depth of the second intermediate hole is smaller than a vertical depth of the second bending hole.

4. The display apparatus according to claim 3, wherein the bending area of the device substrate includes a substrate recess region overlapping with the second bending hole.

5. The display apparatus according to claim 1, wherein a bottom surface of the first intermediate hole is disposed closer to the device substrate than an upper surface of the upper buffer layer, and wherein the upper buffer layer of the bending area includes an upper recess region overlapping with the first bending hole.

6. The display apparatus according to claim 5, wherein a vertical depth of the upper recess region is the same as a distance between the bottom surface of the first intermediate hole and the upper surface of the upper buffer layer.

7. The display apparatus according to claim 1, wherein a source electrode of the switching thin film transistor is connected to a source region of the first semiconductor pattern through a source contact hole, wherein a drain electrode of the switching thin film transistor is connected to a drain region of the first semiconductor pattern through a drain contact hole, and wherein the source contact hole and the drain contact hole penetrate the first semiconductor pattern.

8. The display apparatus according to claim 7, wherein a vertical depth of the source contact hole is the same as a vertical depth of the first intermediate hole, and wherein a vertical depth of the drain contact hole is the same as a vertical depth of the source contact hole.

9. The display apparatus according to claim 1, further comprising a lower buffer layer between the device substrate and the upper buffer layer, wherein the lower buffer layer extends between the device substrate and the light-blocking pattern.

10. The display apparatus according to claim 9, wherein the light-blocking pattern includes a blocking recess region overlapping with the second intermediate hole.

11. A display apparatus comprising:

a device substrate including a pixel area and a bending area;

a buffer insulating layer on the device substrate, the buffer insulating layer including a stacked structure of a lower buffer layer and an upper buffer layer;

a light-blocking pattern between the lower buffer layer and the upper buffer layer of the pixel area;

a first switching thin film transistor on the upper buffer layer of the pixel area, the first switching thin film transistor including a first semiconductor pattern disposed outside the light-blocking pattern;

a separation insulating layer covering the first semiconductor pattern, the separation insulating layer extending on the upper buffer layer of the bending area;

a driving thin film transistor on the separation insulating layer of the pixel area, the driving thin film transistor including a second semiconductor pattern overlapping with a portion of the light-blocking pattern;

a bending open hole disposed on the bending area of the device substrate, the bending open hole including a first bending hole exposing a portion of the lower buffer layer and a second bending hole exposing a portion of the device substrate in the first bending hole; and an intermediate electrode on the separation insulating layer of the pixel area, the intermediate electrode connected to the light-blocking pattern through an intermediate contact hole, wherein a vertical depth of the first bending hole is greater than or equal to a vertical depth of the intermediate contact hole.

12. The display apparatus according to claim 11, further comprising a second switching thin film transistor on the separation insulating layer of the pixel area, wherein the second switching thin film transistor includes a third semiconductor pattern made of the same material as the second semiconductor pattern, and wherein the third semiconductor pattern is spaced away from the intermediate electrode and the second semiconductor pattern.

13. The display apparatus according to claim 11, wherein the lower buffer layer of the bending area includes a lower recess region overlapping with the first bending hole.

14. The display apparatus according to claim 13, wherein a source electrode of the first switching thin film transistor is connected to a source region of the first semiconductor pattern through a source contact hole, wherein a drain electrode of the first switching thin film transistor is connected to a drain region of the first semiconductor pattern through a drain contact hole, and wherein a bottom surface of the source contact hole and a bottom surface of the drain contact hole are disposed closer to the device substrate than an upper surface of the lower buffer layer.

15. The display apparatus according to claim 11, further comprising a capacitor upper electrode between the light-blocking pattern and the second semiconductor pattern.

16. The display apparatus according to claim 15, wherein the capacitor upper electrode includes a material different from a gate electrode of the first switching thin film transistor.

17. The display apparatus according to claim 11, wherein the device substrate further includes a hole area in which a substrate hole is disposed, and a separation area in which a separating partition is disposed, wherein the separation area is disposed between the pixel area and the hole area, wherein the separating partition includes at least one under-cut, and wherein a vertical distance of the separating partition is greater than a vertical depth of the bending open hole.

* * * * *